United States Patent
Wu et al.

(10) Patent No.: US 8,166,379 B1
(45) Date of Patent: Apr. 24, 2012

(54) CALCULATING SOFT INFORMATION FROM A MULTI-LEVEL MODULATION SIGNAL

(75) Inventors: Zining Wu, Los Altos, CA (US); Nedeljko Varnica, Sunnyvale, CA (US); Xueshi Yang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1198 days.

(21) Appl. No.: 11/929,073

(22) Filed: Oct. 30, 2007

Related U.S. Application Data

(60) Provisional application No. 60/864,287, filed on Nov. 3, 2006.

(51) Int. Cl.
*H03M 13/03* (2006.01)
(52) U.S. Cl. ...................................... 714/794
(58) Field of Classification Search .................. 714/755, 714/758, 786, 794
See application file for complete search history.

(56) References Cited

U.S. PATENT DOCUMENTS

| | | | | |
|---|---|---|---|---|
| 5,289,501 A | * | 2/1994 | Seshadri et al. | 375/286 |
| 5,321,725 A | * | 6/1994 | Paik et al. | 375/265 |
| 5,710,790 A | * | 1/1998 | Herzberg et al. | 375/219 |
| 5,960,041 A | * | 9/1999 | Calderbank et al. | 375/292 |
| 6,052,821 A | * | 4/2000 | Chouly et al. | 714/790 |
| 6,311,306 B1 | * | 10/2001 | White et al. | 714/790 |
| 6,549,584 B1 | * | 4/2003 | Gatherer et al. | 375/261 |
| 6,654,924 B1 | * | 11/2003 | Hassner et al. | 714/758 |
| 7,085,987 B2 | * | 8/2006 | Hewitt et al. | 714/755 |
| 7,095,812 B2 | * | 8/2006 | Chan et al. | 375/341 |
| 7,480,342 B2 | * | 1/2009 | Wilhelmsson et al. | 375/286 |

* cited by examiner

*Primary Examiner* — James C Kerveros

(57) ABSTRACT

Apparatus and methods are provided for calculating soft information in a multi-level modulation scheme using one or more nearest neighbors. The nearest neighbors correspond to signal points in a signal constellation set nearest to the value of a received signal. The nearest neighbors of a received signal can be found by using a second symbol-to-signal point mapping for the signal constellation set that is different from the mapping actually used by the signal modulator. The second symbol mapping can be used to simplify the discover of nearest neighbors. Once the nearest neighbors are found in the second symbol mapping, the nearest symbols can be translated back into the actual symbol mapping using, for example, table lookup. The nearest neighbors in the actual symbol mapping can then be used to compute soft information in the form of, for example, log-likelihood ratios (LLRs).

84 Claims, 20 Drawing Sheets

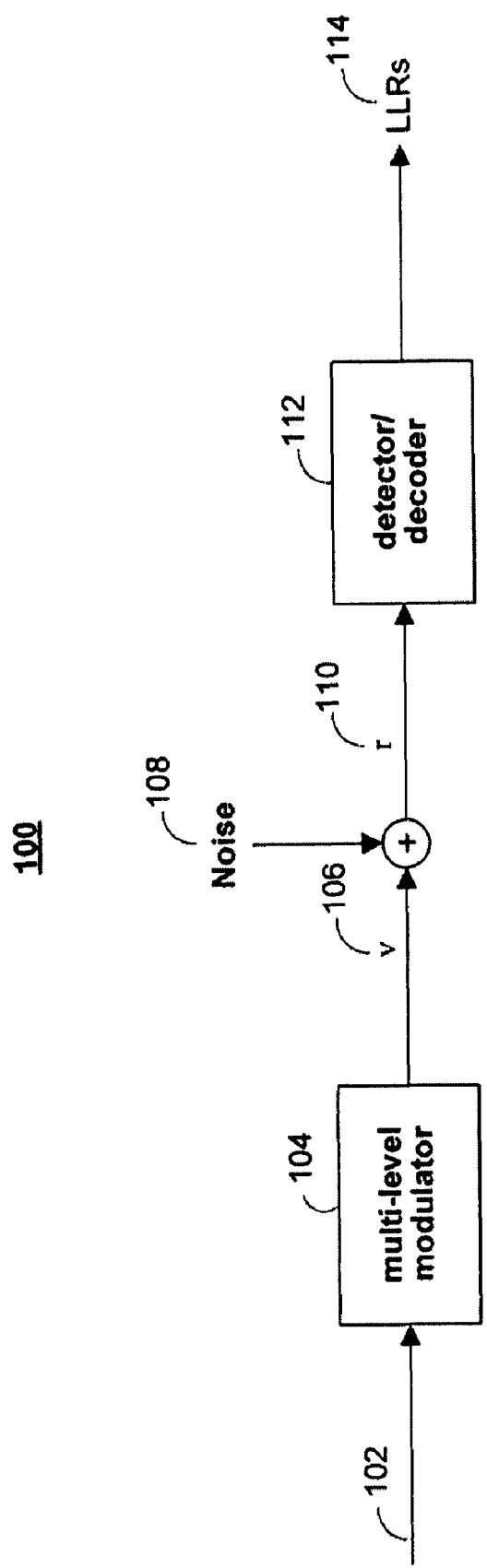

CALCULATING SOFT INFORMATION FROM A MULTI-LEVEL MODULATION SIGNAL

CROSS-REFERENCE TO RELATED APPLICATION

This claims the benefit under 35 U.S.C. §119(e) of U.S. Provisional Application No. 60/864,287, filed Nov. 3, 2006, which is incorporated herein by reference in its entirety.

BACKGROUND OF THE INVENTION

This application relates generally to signal detection, and more particularly to calculating soft information for a signal obtained from a multi-level modulation system.

With the continuing demand for higher-speed digital communications systems and higher-density digital storage systems, various techniques have been applied to increase the capacity of these systems. However, even with high-capacity communications and storage media, their respective bandwidths and densities are still limited. Therefore, multi-level signaling can be applied to fully utilize the available bandwidth or density of these systems. For example, rather than binary signaling, e.g., 2-PAM, some communications system can increase the amount of information transmitted by using four signal levels, e.g., 4-PAM.

However, determining the information contained within a received signal of a multi-level system may be a complex problem. In particular, at each time interval, a received signal may correspond to a plurality of different digital information sequences, or "symbols." Typically, to determine the digital information within a signal at given time interval, soft information for each bit of the digital information is computed based on each possible symbol. The soft information typically corresponds to the likelihood that a particular bit is "0" or "1." Thus, because there can be many possible symbols in multi-level systems, computing soft information at each time interval can require a large amount of high complexity computational circuitry. Furthermore, because these likelihoods may need to be computed frequently, the computational circuitry may also have high power consumption. Accordingly, it would be desirable to provide low complexity and low power techniques for calculating soft information in systems with multi-level modulation.

SUMMARY OF THE INVENTION

Systems and methods are provided for calculating soft information in a multi-level modulation scheme using low complexity computations. The complexity of a computation generally refers to the amount of resources (e.g., silicon area, processing power, processing speed, and number of clock cycles) used for the computation.

Digital information from a digital storage or communications system is communicated using a signal modulated according to a multi-level modulation scheme. That is, to provide a signal representing digital information, a modulator can group bits of the digital information into symbols. To convert the symbols of the digital information into a signal, the modulator uses a signal constellation set corresponding to the multi-level modulation scheme. The signal constellation set includes a plurality of signal points, where each signal point has an associated magnitude/phase and an associated symbol. Thus, the modulator can modulate the symbols of the digital information based on the magnitude and phase of a signal point in the constellation set corresponding to each symbol. The symbol-to-signal point mapping used by the modulator may be referred to as a symbol mapping, and the symbol mapping used by the modulator may be referred to as the first symbol mapping. The first symbol mapping may be, for example, a Gray code or quasi-Gray code mapping, and is preferably chosen to maximize the performance of the storage or communications system.

A signal received from the modulator may be affected by noise, such as noise that can be modeled as additive white Gaussian noise (AWGN). To interpret the noisy received signal, one or more detectors can be used to recover the original digital information. The one or more detectors preferably compute soft information in the form of a log-likelihood ratio (LLR) for each bit of the digital information. To compute a full-precision log-likelihood ratio for a received signal, the value of the received signal may need to be compared to each signal point in the multi-level constellation set. This computation may be overly complex, especially because signal points in the signal constellation set that are not close to the magnitude and phase of the received signal are very unlikely to correspond to the original digital information. Thus, the present invention provides a technique for finding signal points that are likely to be the correct signal point and calculating soft information based these signal points. These likely signal points may be referred to as nearest neighbors, as they preferably correspond to the signal points nearest in value to the received signal.

However, finding the signal points in the signal constellation set closest to a received signal may be a complex task in the first symbol mapping. In particular, because the first symbol mapping can be any arbitrary mapping, the bit value of a symbol may not be related to its position in the signal constellation set. Thus, there may not be a straightforward way to find the symbols closest to a received signal in this first symbol mapping.

Thus, in accordance with an embodiment of the present invention, a low complexity technique is provided for finding nearest neighbors in a multi-level signal constellation set with a first signal mapping. The nearest neighbors preferably correspond to signal points in the multi-level signal constellation set that are closest to the value of a received signal, and are preferably used to estimate a digital information sequence. Rather than finding nearest neighbors in the first symbol mapping, nearest neighbors are preferably found using a second symbol mapping. The second symbol mapping can be chosen such that finding nearest neighbors in the second mapping is less complex than finding nearest neighbors in the first symbol mapping. The first and second symbol mapping can use a different number of bits per symbol. After finding the nearest neighbors using the second symbol mapping, the nearest neighbors can be mapped back into the first signal mapping. That is, the signal points in the constellation set that are chosen as nearest neighbors can be mapped into the symbols that were actually used to transmit the digital information.

In accordance with an embodiment of the present invention, a low complexity technique for computing soft information based on a received signal is provided. First, a signal corresponding to a multi-level modulation scheme, and therefore a multi-level signal constellation set, is preferably received. The received signal preferably corresponds to a digital information sequence, where the digital information sequence is modulated based on a first symbol mapping. The first symbol mapping may be, for example, a Gray code mapping, and is preferably chosen to maximize or minimize one or more system performance metrics, e.g., minimizing bit error rate.

Using the received signal, the nearest neighbors (e.g., the nearest signal points in the signal constellation set) can be found using a second symbol mapping for the signal constellation set. The second mapping can be, for example, a natural or two's complement labeling, and may be used to reduce the complexity of finding nearest signal points. Finding nearest neighbors in the second symbol mapping may first involve scaling and/or shifting the received signal by a scaling factor and/or a shifting factor. The scaling factor may be determined based on the value of the signal points in the signal constellation set and on the bit values of the symbols in the second symbol mapping. Then, the nearest neighbors can be found by rounding the scaled/shifted received signal to the nearest integer. Alternatively, finding nearest neighbors may involve performing a binary search through the signal constellation set to find the nearest signal point, and adding or subtracting integers to find additional nearest signal points. Nearest neighbors can be found in this way for one-dimensional signal constellation sets (e.g., PAM). Also, for multi-dimensional signal sets (e.g., QAM) nearest neighbors can be found by working with each dimension separately to find components nearest to the received signal, and combining the components to obtain the nearest neighbors.

Once nearest neighbors are found in the second symbol mapping, the nearest neighbors can be translated back into the first symbol mapping. The translation may be performed using a table lookup into memory. Thus, the nearest neighbors of the first symbol mapping may correspond to the most likely values of the transmitted digital information sequence. Using these nearest neighbors in the first symbol mapping, soft information, such as log-likelihood ratios, can be calculated for the digital information sequence.

BRIEF DESCRIPTION OF THE FIGURES

The above and other objects and advantages of the invention will be apparent upon consideration of the following detailed description, taken in conjunction with the accompanying drawings, in which like reference characters refer to like parts throughout, and in which:

FIG. 1 shows a simplified diagram of a digital communications or digital storage system with multi-level signaling;

DETAILED DESCRIPTION OF THE INVENTION

Figure 2A:
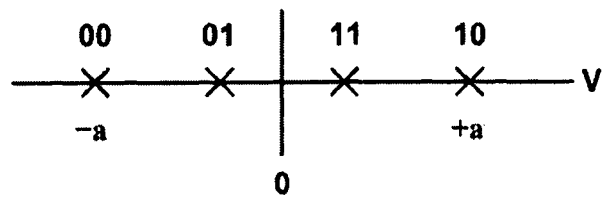
FIGS. 2A-2C show illustrative signal constellation sets with a first signal mapping.

FIG. 1 shows illustrative system 100 of a basic digital communications or storage system. Communications or storage 100 preferably includes multi-level modulator 104 and detector/decoder 112. Multi-level modulator 104 (discussed in detail below) preferably converts digital information 102 into signal 106, also referred to as v. Digital information 102 can represent any type of information to be conveyed (e.g., a sampled/quantized version of an analog signal, binary information, etc.) and can be in any suitable digital form (e.g., coded data, uncoded data, etc.). Digital information 102 may be supplied by any suitable digital information source. For example, the digital information source may be, but is not limited to, a source encoder, an encoder for an error correcting/detecting code (e.g., a convolutional encoder, a Reed-Solomon encoder, a CRC encoder, and LDPC encoder, a turbo code encoder, etc.), a magnetic storage device (e.g., a hard disk), an electrical storage device (e.g., FLASH memory or RAM), or an optical storage device (e.g., a CD-ROM).

Multi-level modulator 104 preferably groups bits of digital information 102 into symbols, b, of two or more bits. Modulator 104 preferably modulates the symbol to a signal that has multiple signal levels (e.g., 4, 8, 16 levels, etc.) by adjusting the magnitude and/or phase of a suitable carrier signal. Thus, it should be understood that a "level" may refer to a particular magnitude and phase associated with a particular symbol. The level of the particular symbol can be illustrated by a signal point in a signal constellation set representing the multi-level modulation scheme. Each possible symbol (e.g., combination of bits) is preferably mapped to a particular signal point in a signal constellation set, where each signal point is preferably mapped to a particular location in the constellation based on the magnitude and phase of that signal point. To transmit a symbol, the carrier signal can be adjusted to the magnitude and phase of the signal point associated with that symbol for a period of time referred to as a "symbol period." The carrier signal may have any suitable frequency (e.g., baseband signal, passband signal, etc.) and any suitable characteristics (a non-return-to-zero (NRZ) signal, etc.). Modulator 104 can use any suitable multi-level modulation scheme, and therefore any suitable multi-level signal constellation set, for converting symbols to signals.

Figure 2B:
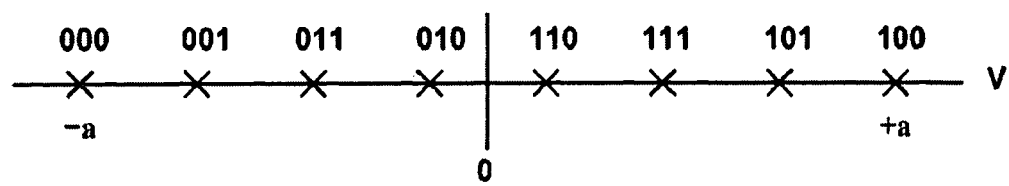
Figure 2C:
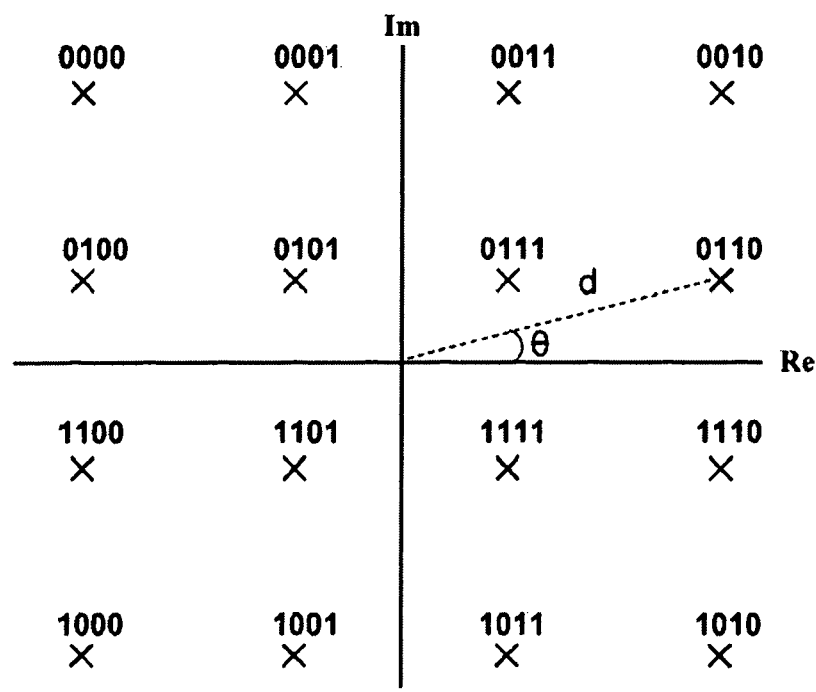

Referring now to FIGS. 2A-2C, illustrative signal constellation sets, corresponding to various modulation schemes, are shown that may be used by a modulator (e.g., multi-level modulator 104). In these figures, as well as in FIGS. 3A-3B and 6-8B, a signal point is illustrated by an "X," and the corresponding symbol is shown above the signal point. The magnitude and phase of a signal point can be determined by its location on the graph relative to the axes.

Referring first to FIGS. 2A and 2B, one-dimensional (1D) signal constellation sets of two different sizes are illustrated. These 1D signal constellation sets may correspond to pulse amplitude modulation (PAM) schemes. That is, the multiple signal levels may be provided by varying only the signal amplitude (e.g., voltage magnitude). In particular, FIG. 2A shows a 4-PAM signal constellation set for mapping two-bit symbols into four signal amplitudes. If the signal points are evenly spaced, a "00" symbol can be mapped to an amplitude of −a, a "01" symbol can be mapped to an amplitude of −a/3, a "11" symbol can be mapped to an amplitude of +a/3, and a "10" symbol can be mapped to an amplitude of +a. This symbol-to-signal point mapping is referred to as a Gray code mapping. For simplicity, a symbol-to-signal point mapping may be referred to as a "symbol mapping," and the particular symbol mapping used by a modulator (e.g., modulator 104 of FIG. 1) may be referred to as a "first symbol mapping." The first symbol mapping can be a mapping other than a Gray code mapping, and a particular mapping (e.g., Gray code mapping in some situations) may be advantageously chosen to maximize the performance of the system (e.g., to minimize bit error rate). A Gray code mapping may be advantageous in many situations, as this mapping uses the fewest number of bits for the size of a constellation set, and each consecutive signal point differs by only a single digit. Thus, when a received signal is incorrectly interpreted to correspond to a neighboring signal point, the resulting symbol is likely to be incorrect for only one bit.

FIG. 2B shows an illustrative 8-PAM signal constellation set that can be used by a modulator (e.g., modulator 104 of FIG. 1) for mapping three-bit symbols into eight signal amplitudes. Similar to the 4-PAM example of FIG. 2A, FIG. 2B shows a Gray code mapping, though again, any other symbol mapping could be contemplated. For a maximum amplitude of a with evenly spaced signal points, the signal points of FIG. 2B can be separated by amplitudes of 2a/7.

Referring now to FIG. 2C, an illustrative two-dimensional (2D) signal constellation set is provided that can be used by a modulator (e.g., modulator 104 of FIG. 1) to modulate symbols to a signal. The 2D constellation set of FIG. 2C is shown on a complex number plane, where the horizontal axis represents real values and the vertical axis represents imaginary values. In a specific application, horizontal and vertical axis may be implemented using two orthogonal carriers, or using two independent symbol intervals. The 2D signal constellation set of FIG. 2C may correspond to a quadrature amplitude modulation (QAM) scheme with 16 signal points, referred to as a 16-QAM modulation scheme. Each symbol can include four bits, and each symbol can be modulated to a signal point having a different amplitude and/or phase. For example, symbol "0110" can be modulated to an amplitude given by distance d and phase θ. The symbol mapping of FIG. 2C shows the least significant two bits of a symbol map onto the real axis using a Gray code mapping, and the most significant two bits map to the imaginary axis also using a Gray code mapping. Any symbol mapping, including Gray code mapping or quasi-Gray code mapping, can be the first symbol mapping used by a multi-level modulator. As described above, the first symbol mapping may be selected to maximize the performance of the system.

Referring back to FIG. 1, modulator 104 outputs signal 106 using any of the modulation schemes of FIGS. 2A-2C, or any other suitable multi-level modulation scheme (e.g., 32-QAM, 8-PSK, 16-PSK, etc.). Before signal 106 reaches a destination, signal 106 may be affected by additive noise source 108. Noise source 108 can have any suitable characteristics and can be noise that is not correlated to signal 106. In some embodiments, noise 108 is preferably modeled by detector/decoder 112 (described below) as additive white Gaussian noise (AWGN) with zero mean and a variance of $\sigma^2$. AWGN can have a conditional probability distribution function (PDF) given by, $$AWGN_{PDF|r} = \frac{1}{\sigma\sqrt{2\pi}}\exp\left(-\frac{\|r - E[r]\|^2}{2\sigma^2}\right), \quad (1)$$

where E[r] can be the value of a signal point in the signal constellation set associated with transmitted signal v. Any noise with any other noise distribution can be assumed by detector/decoder 112. However, for simplicity, it will be assumed that any additive noise affecting a signal 106 is AWGN with a distribution given by equation (1).

In addition to noise source 108, signal 106 may be attenuated or amplified by a channel (not shown). The attenuation or amplification can depend on the particular information being transmitted or stored, and can also depend on the speed of transmission or density of storage. For digital communications systems, the channel may be wired or wireless media through which the signal travels. For digital storage systems, the channel may be the media in which digital information 102 is stored. Thus, the source and the channel of a digital storage system may be the same device. To prevent overcomplicating the description of the present invention, it will be assumed that signal 106 is not attenuated or amplified by a channel. However, it should be understood that the present invention may be altered, or additional components may be added, to account for or cancel out any channel effects.

Because of additive noise source 108, signal 110, or r, may be vastly different from the original signal, v. Furthermore, because signal 106 can have multiple levels, the signal points of the corresponding signal constellation set may be relatively close together. For example, a binary modulation system can provide signal points with amplitudes of +a and −a for a total signal separation of 2a. However, to maintain the same peak energy (e.g., the same maximum signal amplitude), an 8-PAM multi-level system may provide signal points separated by only 2a/7. Thus, any noise from noise source 108 may can have a substantial effect on signal 110, and on the difficulty of accurately interpreting signal 110.

To recover digital information 102, detector/decoder 112 preferably interprets noisy signal 110. Detector/decoder 112 may include any suitable number of detectors or decoders. Detector 112 preferably determines the originally transmitted information (e.g., digital information 102 of FIG. 1) given a symbol period of noisy signal 110. In particular, for each bit in a symbol, detector 112 can determine the likelihood of that bit being a "0" or "1" in digital information 102. These likelihoods may be referred to as "soft information." In contrast, "hard information" refers to decisions of either "0" or "1" without an associated likelihood. The soft information computed by detector/decoder 112 can be in the form of a log-likelihood ratio (LLR) for each bit. The sign of an LLR preferably indicates the most likely value of a bit (e.g., most likely "0" if the LLR positive and most likely "1" if negative), and the magnitude of the LLR preferably indicates the strength or confidence of that most likely value. An LLR for a bit, $b_i$, the ith bit of digital information 102 included in received signal r, is preferably given by, $$LLR(b_i \mid r) = \log \frac{Pr(b_i = 0 \mid r)}{Pr(b_i = 1 \mid r)}. \quad (2)$$

The LLR for each bit of digital information 102 (FIG. 1), or another form of soft information, can be provided from detector/decoder 112 as output 114. The LLR calculations that detector/decoder 112 preferably performs will be discussed below in greater detail in connection with FIGS. 3A-3B and 10. Using the soft information at output 114, a decoder for an error correcting code, such as an LDPC decoder, may be used to correct any errors in the computed soft information.

Figure 3A:
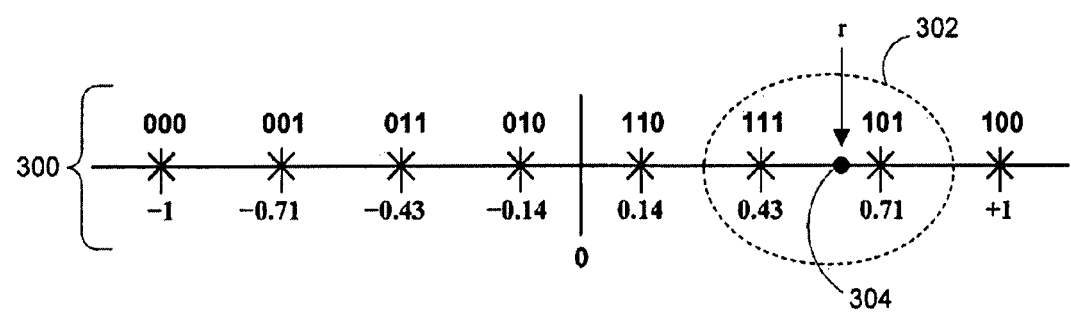
FIG. 3A shows a representation of an illustrative received signal mapped onto the constellation set of FIG. 2B.

Referring now to FIG. 3A, an illustrative symbol period of an 8-PAM modulation scheme is provided to demonstrate LLR calculation in various embodiments of detector/decoder 112. 8-PAM is discussed above in connection with FIG. 2B. Using an 8-PAM scheme, a signal, r, may be received with an amplitude that maps r onto point 304 of graph 300. Because 8-PAM is preferably used with three-bit symbols, to calculate soft information for r, three LLRs are preferably calculated. In particular, for a transmitted or played back three-bit symbol $b=[b_2 b_1 b_0]$, an LLR can be calculated for each of bits $b_2$ (MSB), $b_1$, and $b_0$ (LSB). Using equation (2) above, the LLR for $b_1$ can be calculated according to, $$LLR(b_1 \mid r) = \log \frac{Pr(b_1 = 0 \mid r)}{Pr(b_1 = 1 \mid r)} \quad (3)$$

$$= \log \frac{Pr(b = \text{``001''} \cup b = \text{``000''} \cup b = \text{``100''} \cup b = \text{``101''} \mid r)}{Pr(b = \text{``011''} \cup b = \text{``010''} \cup b = \text{``110''} \cup b = \text{``111''} \mid r)} \quad (4)$$

$$= \log \frac{Pr(b = \text{``001''} \mid r) + \ldots + Pr(b = \text{``101''} \mid r)}{Pr(b = \text{``011''} \mid r) + \ldots + Pr(b = \text{``111''} \mid r)} \quad (5)$$

Notice that, as expected from equation (2), the probability of each possible three-bit symbol is either in the numerator or denominator of equation (4) above based on whether $b_1$ (the center bit) is a "1" or "0." LLRs for the other two bits in the symbol, $b_2$ and $b_0$, may also be computed in a similar manner as equations (3) through equation (5).

For digital communications and storage systems that can assume additive white Gaussian noise, the value of equation (5) can be dominated by the probabilities associated with signal constellation points closest in Euclidean distance to point 304 of FIG. 3. In particular, equation (5) would be dominated by the two signal points surrounding point 304. Thus, the numerator of equation (5) would be dominated by the "101" term and the denominator would be dominated by the "111" term. To simplify the complexity of computing an LLR for k, equation (5) may be approximated by $$LLR_{approx}(b_1 \mid r) = \log \frac{Pr(b = \text{``101''} \mid r)}{Pr(b = \text{``111''} \mid r)}. \quad (6)$$

To improve the approximation, more probabilities from equation (5) can be included in equation (6). For example, two probabilities corresponding to the next two closest signal points may be added to equation (6). That is, the probabilities associated with symbols "100" and "110" could be included, resulting in an approximate LLR equation given by $$LLR_{approx}(b_1 \mid r) = \log \frac{Pr(b = \text{``101''} \mid r) + Pr(b = \text{``100''} \mid r)}{Pr(b = \text{``111''} \mid r) + Pr(b = \text{``110''} \mid r)}. \quad (7)$$

The closest signal points to a received signal used in calculating an LLR may be referred to collectively as the "nearest neighbors" of the received signal. For simplicity, the nearest neighbors can refer to either the signal points of a signal constellation set or to their corresponding symbol values.

Figure 3B:
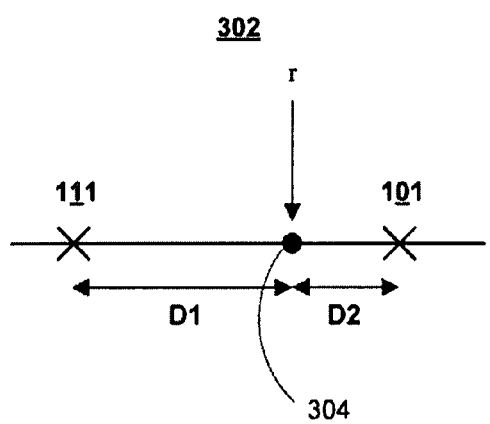
FIG. 3B shows an enlarged section of FIG. 3A.

Referring now to FIG. 3B, a zoomed in portion of FIG. 3A is shown including point 304 representing the amplitude of received signal r. In FIG. 3B, the distance between point 304 and its two nearest neighbors, "111" and "101," is given by distances D1 and D2, respectively. Thus, assuming the noise of r is from an AWGN noise source with a distribution defined in equation (1), the approximate LLR of $b_1$ given by equation (6) preferably equals $$LLR_{approx}(b_1 \mid r) = \log \frac{\exp\left(\frac{-D2^2}{2\sigma^2}\right)}{\exp\left(\frac{-D1^2}{2\sigma^2}\right)}. \quad (8)$$

Note that the approximate LLR of equation (8) can provide significant complexity reduction compared to computing LLRs based on every symbol. In particular, fewer exponentials, which can be complex operations, are preferably calculated. Furthermore, if a natural logarithm is used in equation (8), the approximate LLR calculation can be simplified further to, $$LLR_{approx}(b_1 \mid r) = \frac{D1^2 - D2^2}{2\sigma^2}. \quad (9)$$

With continuing reference to FIG. 3B, the two nearest neighbors of r differ in only one bit position, $b_1$. Therefore, for $b_2$ and $b_0$, calculating LLRs using the same two signal points ("111" and "101") may not be appropriate. In particular, if the two signal points were used for these other bit positions, the terms (e.g., exponentials) for the two signal points would both be in the numerator of the approximate LLR equation. Thus, instead of using the approximate LLR equation, a predetermined, approximate LLR may be used for the other two bit positions. Alternatively, a separate set of nearest neighbors can be found and used in the approximate LLR equation. In other embodiments of the invention, a detector/decoder (e.g., detector/decoder 112) can find enough nearest neighbors to ensure that LLRs can be calculated for each bit position.

It should be understood that the 8-PAM example of FIGS. 3A and 3B are merely illustrative, and that any of the equations and techniques discussed above for calculating log-likelihood ratios may be translated to any other suitable modulation scheme (e.g., 4-PAM, 32-PAM, 4-QAM, 16-QAM, 64-QAM, 8-PSK, etc.).

Referring back to FIG. 3A, determining the nearest neighbors of r can be a complex task. In particular, the first symbol mapping used to modulate a digital sequence is preferably chosen for system performance, and not for ease in finding nearest neighbors. Therefore, there may not be a straightforward way to determine the nearest neighbors of a received signal. Gray code mapping, for instance, and as shown in FIG. 3A, may provide symbol values that provide little insight into the value of its corresponding signal points. Therefore, known techniques to find nearest neighbors involve performing an exhaustive search of signal points. That is, the value of a received signal can be compared to the expected signal value for each symbol, and the closest signal points can be selected based on Euclidean distance or another distance metric. Performing an exhaustive search may be highly complicated. Therefore, an embodiment of the present invention provides an improved technique for finding any number of nearest neighbors.

Figure 4:
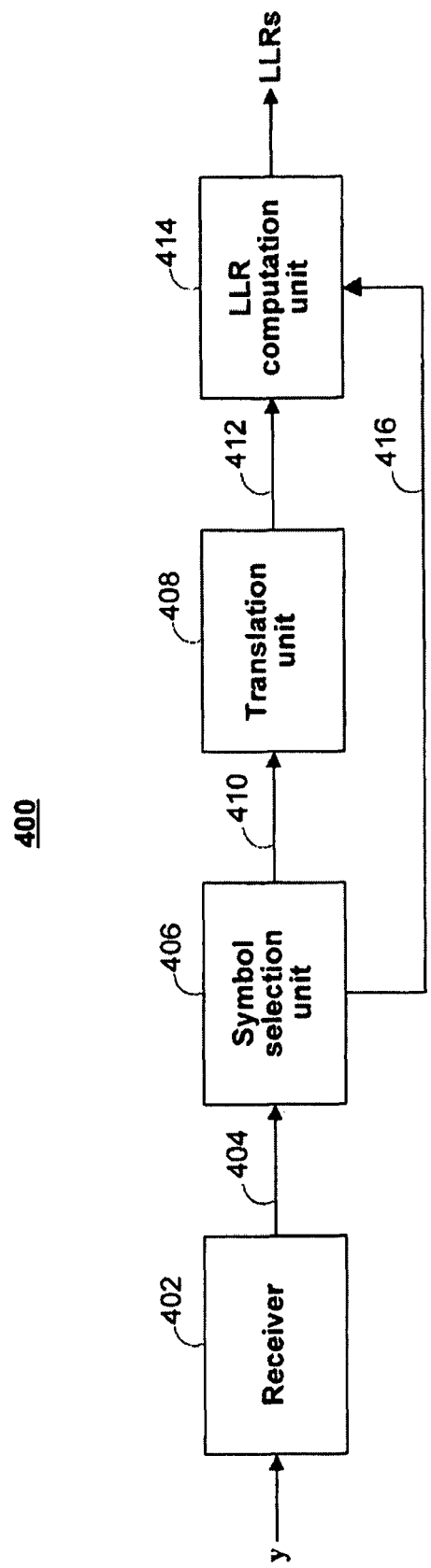
FIG. 4 shows an illustrative detector for calculating soft information.

Referring now to FIG. 4, illustrative detector 400 is shown for computing LLRs in accordance with an embodiment of the present invention. Detector 400 may include any features and functionalities of detector/decoder 112 of FIG. 1. Detector 400 includes receiver 402, symbol selection unit 406, translation unit 408, and LLR computation unit 414. Receiver 402 can receive a signal, r, from a suitable channel. Receiver 402 may include any suitable circuitry (e.g., wireless antennas) for obtaining the signal. Receiver 402 may also include any ports (e.g., a serial port) or interfaces (e.g., a network interface) for coupling to the medium though which r is obtained. In some embodiments, receiver 402 may also include filters or other processing circuitry to, for example, reduce the effect of noise on the signal. Thus, at output 404, receiver 402 may provide a signal that may or may not be same as signal r. For simplicity in describing the present invention, it will be assumed that receiver 402 provides a signal substantially equal to r.

Using the signal from input 404, symbol selection unit 406 preferably finds symbols in a signal constellation set nearest to the received signal. These symbols found by symbol selection unit 406 may correspond to a symbol mapping different from the actual symbol mapping. That is, rather than using the symbol mapping applied by the modulator (e.g., modulator 104 of FIG. 1), a different symbol mapping is preferably applied to the signal points of the signal constellation set. This different symbol mapping can be chosen to simply the discovery of nearest neighbors, and may be referred to as a "second symbol mapping." In some embodiments, the second symbol mapping may be a natural or two's complement mapping. Symbol selection unit 406 preferably produces a set of one or more nearest neighbor symbol values in the second symbol mapping, and provides this set at output 410. In addition, at output 416, symbol selection unit 406 may output information based on the distance between received signal r and each of the nearest neighbors (e.g., D1 and D2 of FIG. 3B). Illustrative examples of the operation of symbol selection unit 406 are described below in connection with FIGS. 6-8B.

From the set of nearest neighbor symbols obtained from symbol selection unit 406, translation unit 408 preferably translates the symbols of the second symbol mapping to symbols of the first symbol mapping. Translation unit 408 can perform the translation from the second to first symbol mapping using a table lookup. Thus, translation unit 408 may include a storage for use in the table lookup. The storage can be any suitable type of storage, such as a read-only memory (ROM). Alternatively, translation unit 408 may perform the translation using combinational logic. Translation unit 408 preferably provides the set of symbols in the first symbol mapping at output 412. These symbols preferably correspond to the most likely symbol values of received signal r.

With continuing reference to FIG. 4, LLR computation unit 414 preferably computes soft information for signal r. That is, using the nearest neighbors obtained from input 412 and their relative distances to the received signal from input 416, LLR computation unit 414 may calculate LLRs according to any of equations (2)-(9), or using a variation of these equations. In particular, if two nearest neighbors are obtained, LLR computation unit 414 may include the circuitry necessary to compute equation (8), reproduced below as equation (10).

$$LLR_{approx}(b_1 \mid r) = \log \frac{\exp\left(\frac{-D2^2}{2\sigma^2}\right)}{\exp\left(\frac{-D1^2}{2\sigma^2}\right)}. \tag{10}$$

To compute equation (10) above or a similar equation, LLR computation unit 414 may include circuitry for computing exponentials and logarithms. Also, D1 and D2 in equation (10) may be obtained from symbol selection unit 406 at input 416, and the setup of equation (10) may be based on the nearest symbols from input 412. In other embodiments of the present invention, LLR computation unit 414 may compute distances D1 and D2, as well as any other distances.

Figure 5A:
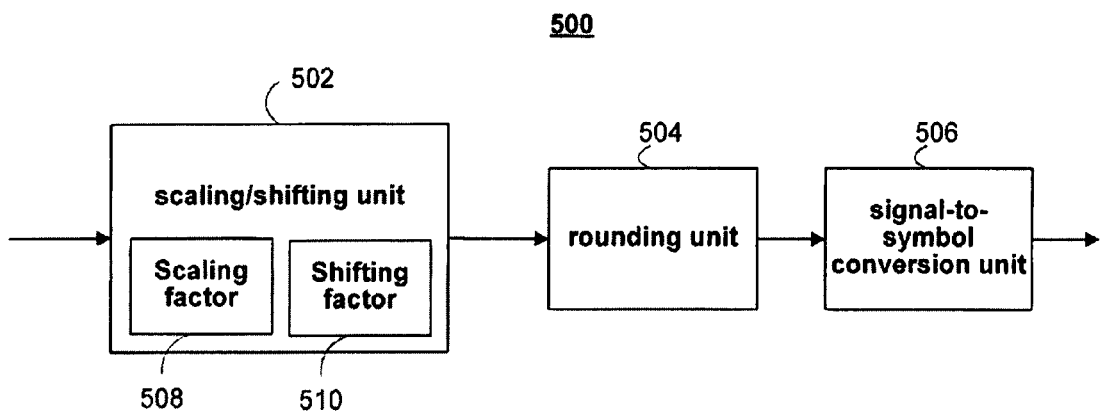
FIGS. 5A and 5B show illustrative symbol selection units for finding nearest neighbors.
Figure 5B:
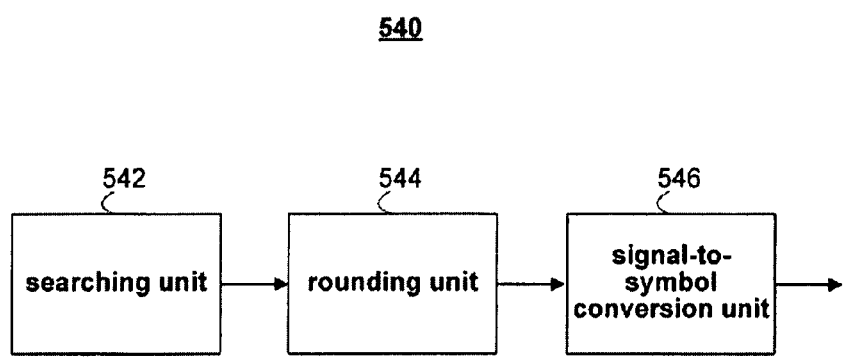

Referring now to FIGS. 5A and 5B, two illustrative embodiments 500 and 540 of symbol selection unit 406 are shown. Symbol selection unit 500 is preferably used with signal constellation sets that have uniformly distributed signal points, and preferably includes scaling/shifting unit 502, rounding unit 504, and signal-to-symbol conversion unit 506. Scaling/shifting unit 502 may include circuitry for scaling an input by scaling factor 508 and for shifting an input (or a scaled input) by shifting factor 510. These scaling and shifting functions may be implemented using one or more multipliers and adders of any suitable implementation. Rounding unit 504 may include any suitable computation circuitry for computing rounding functions on the scaled and/or shifted input, such as ceiling (e.g., round up) and floor (e.g., round down or truncate) functions. Signal-to-symbol conversion unit 506 preferably converts the output of rounding unit 504 to a symbol value. Signal-to-symbol conversion unit 506 may include an analog-to-digital converter for making this conversion or may include any other suitable circuitry for making the conversion. An illustrative operation of symbol selection unit 500, and in particular units 502, 504 and 506, will be described below in connection with FIGS. 6, 7A, and 7B. Thus, it should be understood that symbol selection unit 500 may additionally include any suitable control circuitry for performing the operations described in connection with these figures.

Symbol selection unit 540 of FIG. 5B may be used for multi-level modulation schemes having signal constellation sets that have either uniformly or non-uniformly distributed signal points. Symbol selection unit 540 preferably includes searching unit 542, rounding unit 544, and signal-to-symbol conversion unit 546. Searching unit 542 preferably includes circuitry for performing a search algorithm based on an input signal, such as a binary search. Rounding unit 544 and conversion unit 546 may include features and functionalities similar to rounding unit 504 and conversion unit 506 of FIG. 5A, respectively. In addition, rounding unit 544 may perform rounding functions based on the search result of searching unit 542. An illustrative operation of symbol selection unit 540, and in particular units 542 and 544, will be described below in connection with FIGS. 6, 7A, and 7B. Thus, it should be understood that symbol selection unit 540 may additionally include any suitable control circuitry for performing the operations described in connection with these figures.

It should be understood that any of the components of symbol selection units 406, 500, and 540 (FIGS. 4, 5A, and 5B) can be implemented using any suitable approach. In particular, the components may be implemented using any suitable hardware-based approach (e.g., using combinational logic, registers, etc.), a firmware based approach, or a combination of hardware and firmware. Furthermore, and illustrated below in connection with FIGS. 10-12, the components of symbol selection units 406, 500, and 540 may be implemented in software. Thus, it should be understood that the components of these symbol selection units are not limited to any particular implementation.

Figure 6:
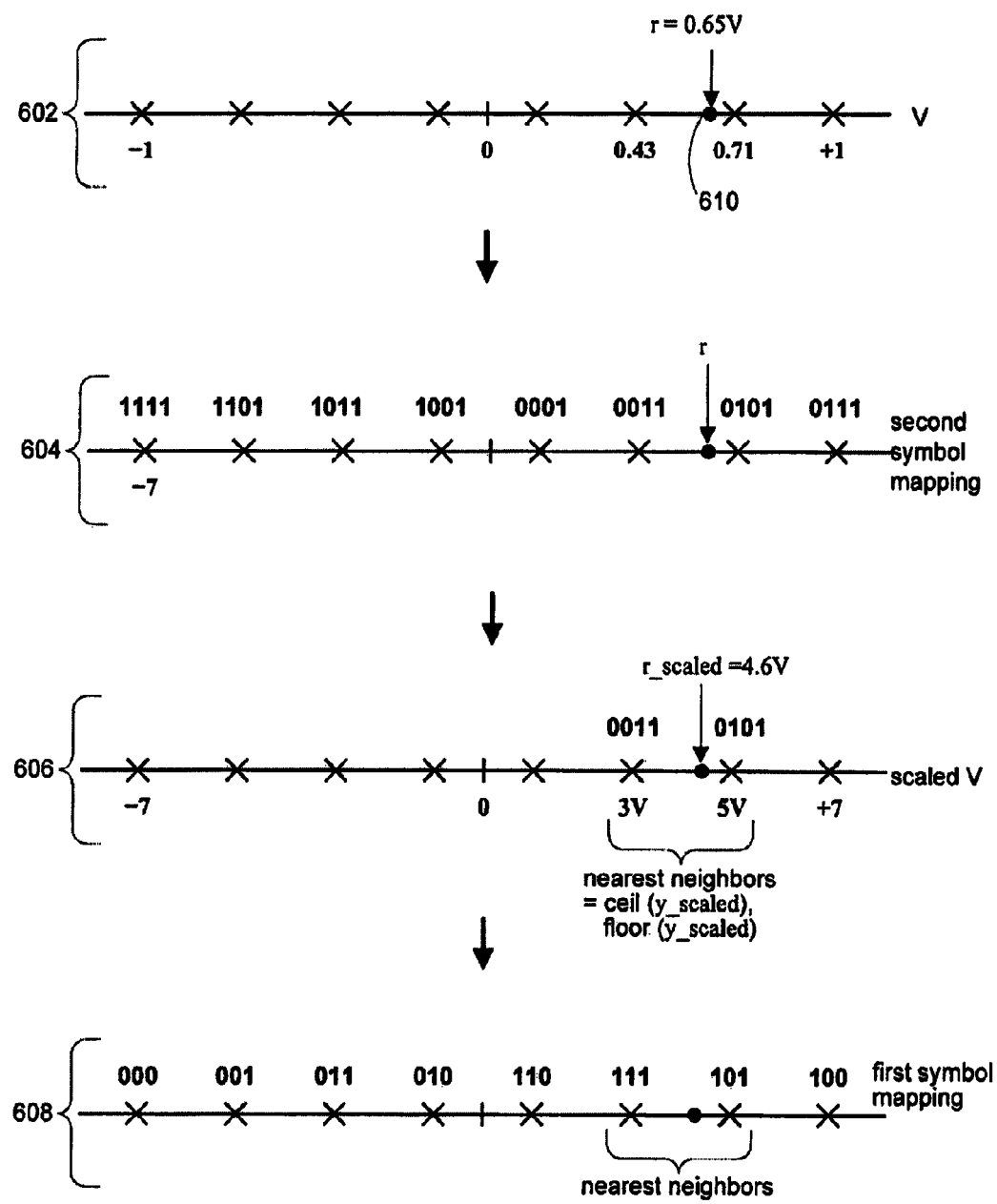
FIG. 6 shows an illustrative process for finding the nearest neighbors of a received signal in an 8-PAM system.

Referring now to FIG. 6, the operation of a detector/decoder (e.g., detector 400 of FIG. 4) is illustrated. The signal constellation sets shown in graphs 602, 604, 606, and 608 show an 8-PAM scheme, where each symbol is preferably transmitted using eight signal amplitudes. 8-PAM is discussed above in connection with FIG. 2B. The signal points of the signal constellation set in graph 602 illustrate the expected values of a received signal for each possible signal level. These signal points may or may not have substantially the same value as the signal points used by the modulator (e.g., modulator 104 of FIG. 1), though each signal point in the constellation set of graph 602 preferably corresponds to a signal point in the constellation set used by the modulator. For illustrative purposes, the signal points of the signal constellation set in graph 602 are assumed to fall between voltages of −1 to +1, and the first symbol mapping used by the modulator is assumed to be the Gray code mapping illustrated in FIG. 2B. Assume again for illustrative purposes that the detector receives a signal, r, with a voltage of 0.65V. Thus, received signal r can map onto graph 602 at point 610.

Even though the signal points of the signal constellation set in graph 602 (FIG. 6) preferably map to symbols using a first symbol mapping—a Gray code mapping—that improves system performance, a different mapping can be temporarily used to process a received signal. For example, in a digital communications system, symbols may be transmitted using the Gray code mapping shown in FIG. 3A, but the detector can assume a symbol mapping shown in graph 604. The symbol mapping of graph 604 is referred to as natural labeling or sign-magnitude labeling. That is, the MSB of each symbol can indicate the sign of the signal point, while the remaining three bits can indicate a relative magnitude of the signal point. Natural labeling preferably simplifies the discovery of nearest neighbors, as there is a logical relationship between the value of the signal point and the value of its corresponding symbol. Another symbol mapping that may also be contemplated is two's complement.

With continuing reference to FIG. 6, in some embodiments of the present invention, the voltages of graph 602, and therefore the value of received signal r, may be scaled (e.g., using scaling/shifting unit 502 of FIG. 5). The voltages can be scaled by a scaling factor (e.g., scaling factor 508 of FIG. 5) to correspond to the bit value of the symbols in the second symbol mapping. For example, the natural labels of graph 604 range from "1111" (or −7) to "0111" (or +7), while the voltage level of a received signal can range from −1V to +1V. Therefore, the voltages can be scaled by a scaling factor of seven to correspond to the bit values of the symbols in the second symbol mapping. The result of this scaling is illustrated in graph 606, where the received signal, r=0.65V, is scaled to $r_{scaled}$=4.6V in graph 606. In some embodiments, the received signal may also be shifted by a shifting factor (e.g., shifting factor 510 of FIG. 5). Shifting may be necessary if the signal constellation set is not centered around zero.

After scaling received signal r, two nearest neighbors are preferably obtained by finding the closest odd integers to the scaled received signal value, 4.6V. A first nearest neighbor can be obtained by computing ceil ($r_{scaled}$=4.6V)=5V, and a second nearest neighbor can be obtained by computing floor ($r_{scaled}$=4.6V)=3V. These functions may be computed by a rounding unit, such as rounding unit 504 of FIG. 5. Thus, because of the correspondence between signal values in the scaled axis and the symbols of the first symbol mapping, 5V and 3V can be translated directly to symbol values of "0101" (five in natural labeling) and "0011" (three in natural labeling) using a conversion unit, such as conversion unit 506 of FIG. 5.

Notice that the symbols of the first and second symbol mapping do not have the same number of bits. In particular, the first symbol mapping in the example above includes three bits, while the second symbol mapping includes four bits. Thus, the present invention does not restrict the choice of first and second symbol mappings in any way, and any suitable number of bits can be used in either symbol mapping.

With continuing reference to FIG. 6, using the technique described above, any number of nearest neighbors can be found. For any desired number of additional nearest neighbors, the detectors preferably performs one or more additional rounding functions using, for example, rounding unit 504 of FIG. 5. For example, as shown in graph 608 of FIG. 6, four nearest neighbors can be found by rounding to the next two integers closest to 3V and 5V—that is, 1V ("0001") and 7V ("0111"). Thus, as any number of nearest neighbors can be found using only scaling and rounding functions, the computations performed by detectors/decoders of the present invention are preferably much less complex than known computations (e.g., exhaustive searches) for finding nearest neighbors.

Furthermore, although finding even numbers of nearest neighbors have been illustrated thus far, an odd number of nearest neighbors can be determined using the techniques of the present invention. For the illustration of FIG. 6, to determine an three nearest neighbors, a detector (e.g., detector/decoder 400 of FIG. 4) preferably finds all except one of the nearest neighbors (that is, two nearest neighbors) using the technique described above. To find the final nearest neighbor, which in this case is the third nearest neighbor, the detector preferably determines which of the nearest neighbor thus identified is closest to the scaled received signal, and preferably finds an additional signal point in the direction of that closest nearest neighbor. Thus, to find the third nearest neighbor, scaled received signal $r_{scaled}$=4.6V can be compared to one or both of 3V and 5V, the two nearest neighbors discovered thus far. Because $r_{scaled}$=4.6V is closer to 5V, the detector preferably chooses a third signal point in the direction of the 5V signal point. Thus, the detector preferably determines that the "0111" (or +7) symbol is the third nearest neighbor.

It should be understood that the examples provided above for determining the nearest neighbors of a received signal are merely illustrative. The detector may operate differently in different situations. In particular, the detector may operate differently if the received signal is close to an end of the signal constellation set, and may operate based on the knowledge that there may be no further signal points beyond a certain level (e.g., +/−7V in graph 606 of FIG. 6).

With continuing reference to FIG. 6, after finding the nearest neighbors of r in the second symbol mapping that is different than the first symbol mapping (e.g., the actual symbol mapping used by the modulator), the nearest symbols of the second symbol mapping may be translated to symbols of the first symbol mapping. That is, if two nearest neighbors, "0011" and "0101," are found for r in the second symbol mapping, these two symbols can be mapped to symbols "111" and "101," respectively, of the first symbol mapping. Thus, symbols "111" and "101" represent the two actual nearest neighbors, and therefore the most likely values, of received signal r. The translation illustrated in FIG. 6 can be performed by a translation unit, such as translation unit 408 of FIG. 4. Using the technique illustrated in FIG. 6, the nearest neighbors in the actual, first symbol mapping can be calculated quickly and with low complexity.

The technique for finding nearest neighbors illustrated in FIG. 6 can be extended to multi-dimensional signal constellation sets, such as 2D QAM signal sets.

Figure 7A:
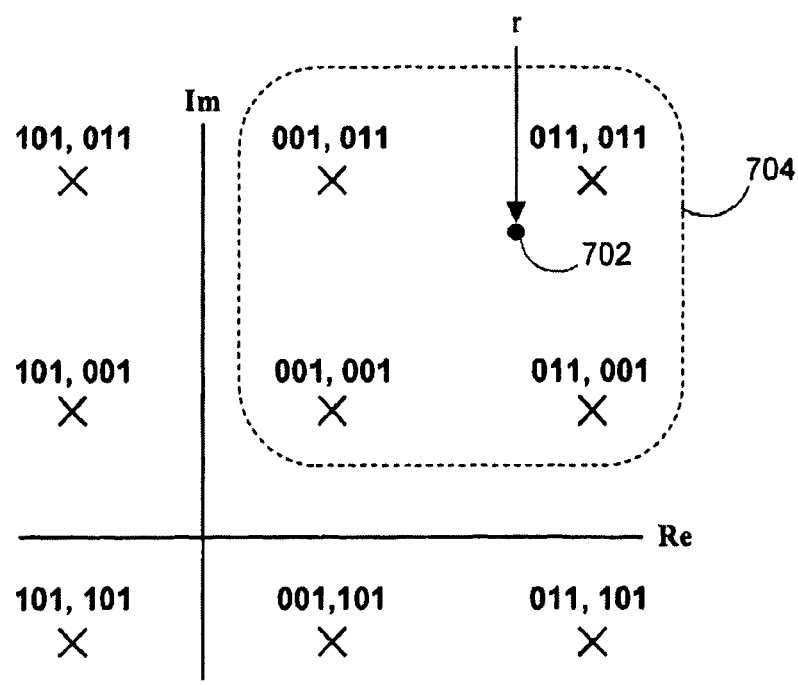
FIGS. 7A-7B show an illustrative process for finding the nearest neighbors of a received signal in a 16-QAM system.
Figure 7B:
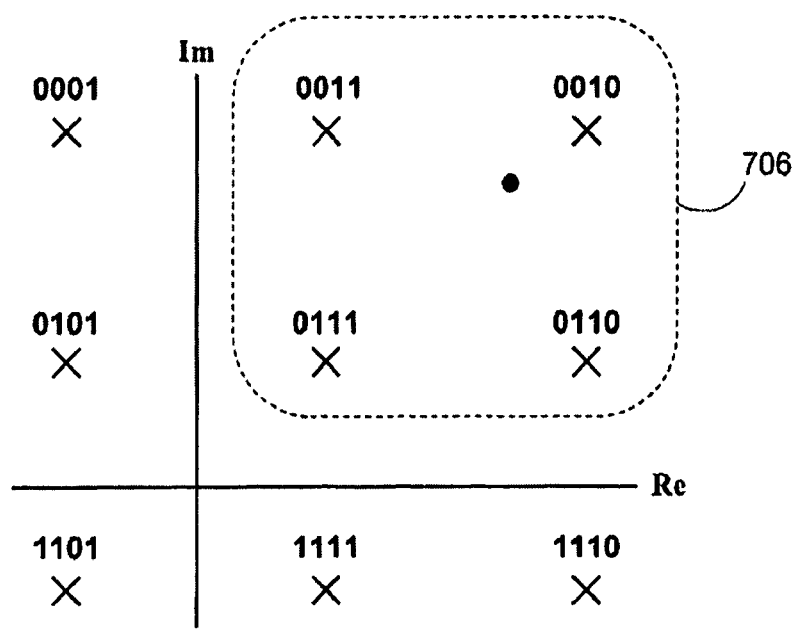

Referring now to FIGS. 7A and 7B, a portion of a 2D 16-QAM constellation set is shown. In particular, nine signal points of 16 total points are illustrated. 16-QAM transmission schemes are described in greater detail above in connection with FIG. 2C. In some embodiments of the present invention, a receiver that obtains signals according to a 16-QAM signal set can initially use a second symbol mapping shown in FIG. 7A. The illustrative mapping is a natural labeling, where the most significant three bits vary according to location on the real axis, and the least significant three bits vary according to location on the imaginary axis. For this 2D example, the illustrated symbol mapping may again be referred to as the second symbol mapping. Although natural labeling is shown, any other labeling that simplifies the discovery of nearest neighbors (e.g., two's complement) may be used instead.

Assume for the purpose of illustration that the 16-QAM system of FIG. 7A receives a signal, r, corresponding to signal point 702. That is, r is preferably a signal with a magnitude and phase that maps its corresponding signal point onto a complex number plane relative to the QAM signal points at point 702. Thus, if four nearest neighbors are desired, as described in detail below, a detector of the present invention (e.g., detector 400 of FIG. 4) can find the four signal points within region 704. Alternatively, additional signal points (e.g., all nine of the illustrated signal points) or fewer signal points (e.g., two or three signal points) can be found if a different number of signal points are desired.

In some embodiments of the present invention, to find the nearest neighbors of a received signal in a multi-dimensional signal set, each dimension can be considered separately. For the illustration of FIG. 7A, received signal r can be processed in both the real dimension and the imaginary dimension. In each dimension, the received signal can be processed in a similar manner as that described above in connection with FIG. 6 for one-dimensional signal sets. In particular, the real component of r may be scaled by a scaling factor such that its scaled amplitude corresponds to the real part of the symbol values. Then, a ceiling and floor function preferably reveals the real values of at least some of the nearest neighbors of r. In this example of FIG. 7A, the real values of the nearest neighbors are preferably "001" and "011." Similar scaling and rounding functions are preferably applied to the imaginary part of r, which also preferably provides imaginary symbol components of "001" and "011." The separate dimensions of a multi-dimensional received signal can be processed in parallel to increase processing speed. Thus, in some embodiments, the components of a detector (e.g., scaling/shifting unit 502, rounding unit 504, and conversion unit 506 of FIG. 5) may each include double the circuitry to process the imaginary and real components of a received signal concurrently. Alternatively, to reduce the amount of circuitry in each of component of the detector, the separate dimensions can be processed sequentially, or they can be processed using a combination of sequential and parallel processing.

In some embodiments of the present invention, finding nearest neighbors may not involve completely separating the dimensions of a constellation set for processing a received signal. In these embodiments, some of the processing may be common for more than one dimension. For example, scaling of the received signal may be performed prior to processing r based on each dimension. In particular, a scaling unit (e.g., scaling unit 502 of FIG. 5) may scale r by fixing the phase of signal point 702 (FIG. 7A) and scaling the magnitude. Once y is scaled, each dimension of the scaled r can be treated separately.

After finding real and imaginary components that correspond to the nearest neighbors of r, each combination of the discovered real and imaginary components are preferably taken to reveal the actual nearest neighbors. Thus, for the example of FIG. 7A, if four nearest neighbors are desired, a detector or decoder (e.g., detector/decoders 112 of FIG. 1) can use the nearest real components of "001" and "011" and the nearest imaginary components of "001" and "011" to discover that the four nearest neighbors in the second symbol mapping are "001,011," "011,001," "001,001," and "011,011."

To reveal the nearest symbols in the first symbol mapping, the nearest symbols in the second symbol mapping can be translated into the first symbol mapping. The translation may be performed using a translation unit, such as translation unit 408 of FIG. 4. Thus, for four nearest neighbors, the translation unit may determine that the symbols illustrated in region 706 of FIG. 7B are the true nearest neighbors of received signal r.

Additional rounding functions in each dimension may be included if a greater number of nearest neighbors are desired. In the example of FIG. 7A, the next nearest component, "101," can be included in both the set of nearest imaginary components and the set of nearest real components in addition to the previously discovered components "011" and "001." "101" is preferably found by looking for the next closest integer to those already discovered. By including each combination of these components, the detector/decoder can find all nine of the signal points in FIG. 5A. It should be understood that, by simple modifications or with additional processing, any number of nearest neighbors can be found using the techniques of the present invention. These variations may be obtained through substantially the same process as finding additional nearest neighbors or reducing the number of nearest neighbors described above for the one-dimensional case. That is, the techniques described above may be carried out in each dimension. Also, cross-dimensional comparisons, as opposed to comparisons within the same dimension, may also be performed to determine in which direction (e.g., dimension) additional nearest neighbors should be added or reduced.

The present invention may also be utilized for signal constellation sets that have a non-uniform distribution of signal points, as described below in connection with FIGS. 8A and 8B.

Figure 8A:
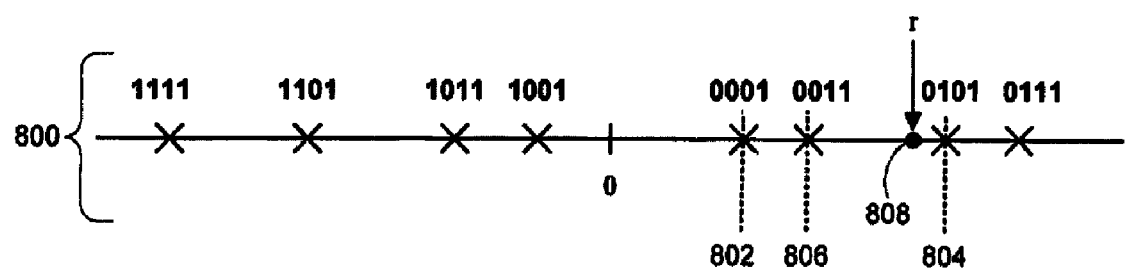
FIGS. 8A-8B show an illustrative non-uniform signal constellation set with a first and second symbol mapping.
Figure 8B:
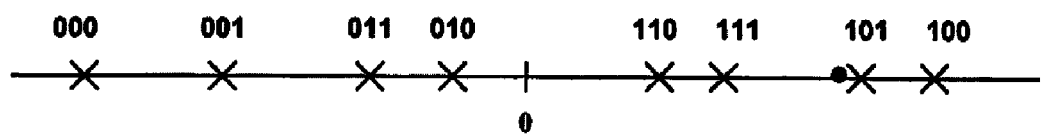

Referring now to FIGS. 8A and 8B, an example of a one-dimensional signal constellation set with a non-uniform distribution of signal points is illustrated. The signal points illustrated in these figures are clearly non-uniformly distributed as the distance between the signal points for symbols "1101" and "1011" is greater than the distance between the signal points for symbols "1011" and "1001." Even with a natural labeling, because of this nonlinear distribution, linearly scaling the received signal with a scaling factor as previously described may not produce a scaled value that accurately corresponds to the symbols of the signal constellation set. Thus, the above described techniques may not accurately find nearest neighbors for a constellation set with non-uniformly distributed signal points. Accordingly, a different technique may be applied for these distributions.

With continuing reference to FIG. 8A, a binary search can be conducted to find a signal point closest to signal point 808 of received signal r. That is, using a systematic strategy for searching graph 800, a single nearest neighbor can be discovered quickly and with low complexity. It should be understood that the present invention is not limited to binary searching, and any other systematic strategy for searching graph 800 may be contemplated. The binary search, or any other suitable searching algorithm, may be performed by a searching unit of a detector, such as searching unit 542 of FIG. 5B.

An example of a binary search is described herein with reference to FIG. 8A. First, the value of the received signal, represented by signal point 808, can be compared to the signal point of the center-most symbol. As "0000" (zero) is not used, either symbol "1001" (−1) or "0001" (+1) may be chosen as the center-most signal point. For the purpose of illustration, "0001" is chosen. Thus, middle point 802, the signal point for "0001," may be compared to signal point 808. Because signal point 808 is greater than middle point 802, the points less than middle point 802 are preferably discarded. Of the remaining signal points, a new middle symbol is preferably selected. In this example, "0101" can be chosen as the new middle point. Thus, signal point 808 can be compared to new middle point 804. From the comparison, any points greater than new middle point 804 may be discarded. Finally, another middle symbol may be selected, "0011," and its corresponding signal point may also be compared to the received signal. After this comparison, because there are no further middle points to choose, and because signal point 806 is further from the received signal than signal point 804, the binary search preferably reveals that symbol "0101" is the closest signal point to signal point 808 of the received signal. Thus, using only three comparisons, the binary search can determine the nearest symbol.

The binary search can also reveal the second closest signal point to signal point 808 corresponding to the received signal. For example, rather than performing the final comparison to determine whether symbol "0011" or symbol "0101" is closer to the received signal, both signal points may be selected as nearest neighbors. In fact, in some embodiments of the present invention, the binary search may terminate before the final comparison, as symbols "0011" and "0101" are already revealed as the two closest signals. In other embodiments, at the completion of the binary search, the information obtained from the binary may be used to determine other nearest neighbors. For example, at the completion of the binary search, it is preferably clear that "0101" is the closest signal point and that the received signal is less than this nearest neighbor. Therefore, using a rounding unit (e.g., rounding unit 544 of FIG. 5B), a second symbol can be selected by finding the next odd integer less than "0101" (five)—that is, "0011" (three). In addition, because the closest signal point is known from the binary search, the detector can determine an odd number of nearest neighbors easily. For example, if a third nearest neighbor is desired, a detector could choose the symbol closest to this nearest neighbor, or "0111." Although the nonlinear distribution of the signal points in the signal constellation set may complicate the process of finding additional nearest neighbors, the knowledge of the closest neighbor from the binary search may provide information to simplify or guide the process.

The second symbol mapping, which in FIG. 8A is a natural labeling, is preferably more appropriate for performing a binary search than the actual, first symbol mapping. Because natural labeling provides symbols in an ascending order, finding a center symbol is not complex. That is, finding the center symbol may involve computing the average of all of the remaining symbols, and choosing the symbol closest to this average. The first symbol mapping representing the actual mapping, which may be any arbitrary mapping, is not necessary in any logical order. Thus, finding a center symbol may not be a straightforward task, and could necessitate an exhaustive search. Therefore, operating in a second symbol mapping, rather than the actual symbol mapping, can provide significant complexity reduction.

Once the nearest neighbors in the second symbol mapping are determined, the symbols of the nearest neighbors may be translated into symbols of the first symbol mapping. The first symbol mapping may be a Gray code mapping, as illustrated in FIG. 8B. The translation from the second symbol mapping to the first symbol mapping may be performed by a translation unit, such as translation unit 408 of FIG. 4. Once the nearest neighbors are translated to the actual, first symbol mapping, soft information for the transmitted or played back digital information sequence is preferably computed using the nearest neighbors. The soft information may computed by a LLR computation unit, such as LLR computation unit 414 of FIG. 4.

It should be understood that the above binary searching examples are merely illustrative. In particular, the binary searching algorithm may be modified without departing from the scope of the invention, or any other systematic searching strategy may be used. Furthermore, although binary searching has been described above in reference to signal constellation sets with non-uniform signal points, binary searching or any other similar technique may be used with a signal constellation set of uniformly distributed signal points.

The above described searching strategy for finding nearest neighbors can also be extended to a multi-dimensional signal constellation set, such as a QAM signal set. The strategy can be extended to multiple dimensions in much the same way as extending the strategy for finding nearest neighbors in uniformly distributed signal points described above in connection with FIGS. 7A-7B. Therefore, the description for extending the searching strategy to multiple dimensions will be brief. For signal sets in multiple dimensions, a search (e.g., binary search) may be conducted in each dimension (e.g., a real dimension and an imaginary dimension). From the search result, the nearest component for each dimension is preferably found, from which other nearest components can also be found. By taking combinations of these components, a plurality of nearest neighbors can be revealed.

Figure 9:
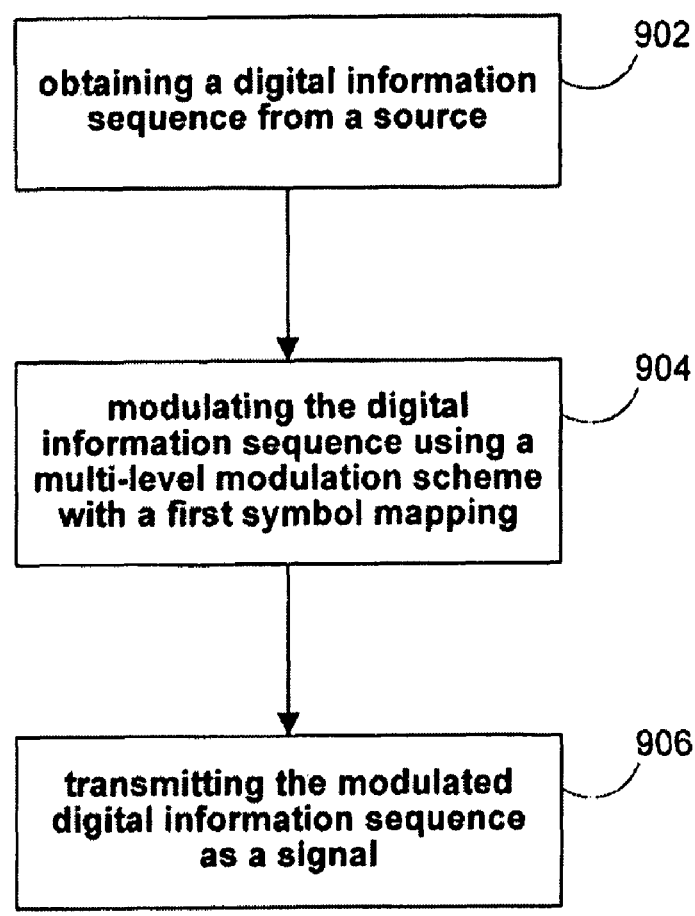
FIG. 9 shows an illustrative flow diagram for transmitted digital information in a multi-level modulation system.

Referring now to FIG. 9, illustrative flow diagram 900 is shown for transmitting or storing a signal in a multi-level modulation system in accordance with an embodiment of the present invention. At step 902, a digital information sequence is preferably obtained from a digital source. The digital information sequence is preferably a sequence of bits representing information from the digital source. The digital source can be, for example, a source encoder, an encoder for an error correcting/detecting code (e.g., a convolutional encoder, a Reed-Solomon encoder, a CRC encoder, an LDPC encoder, a turbo code encoder, etc.), a magnetic storage device (e.g., a hard disk), an electrical storage device (e.g., FLASH memory or RAM), or an optical storage device (e.g., a CD-ROM).

After obtaining a digital information sequence, at step 904, the digital information sequence is preferably modulated using a multi-level modulation scheme with a first symbol mapping. The digital information sequence may be modulated using any suitable number of levels (e.g., 4, 8, 16, etc.), may group bits into any sized symbol based on the number of signal levels, and may modulate the symbols according to a suitable signal constellation set (e.g., PAM, QAM, PSK, etc.). The signal constellation set may have a uniform or non-uniform distribution of signal points. The first symbol mapping of symbols to signal points of the signal constellation set is preferably chosen to maximize the performance of the overall system. In some embodiments, the first symbol mapping can be chosen to minimize the bit error rate of the transmitted digital information sequence. The modulated digital information sequence is preferably transmitted or played back at step 906 as a signal with multiple levels. The multi-level signal can be transmitted or played back through a suitable channel (e.g., a communications or storage channel) and toward a suitable receiver.

It should be understood that flow diagram 900 of FIG. 9 is merely illustrative. Any of the steps in flow diagram 900 may be modified or rearranged, and any additional components may be added, without departing from the scope of the scope of the invention.

Figure 10:
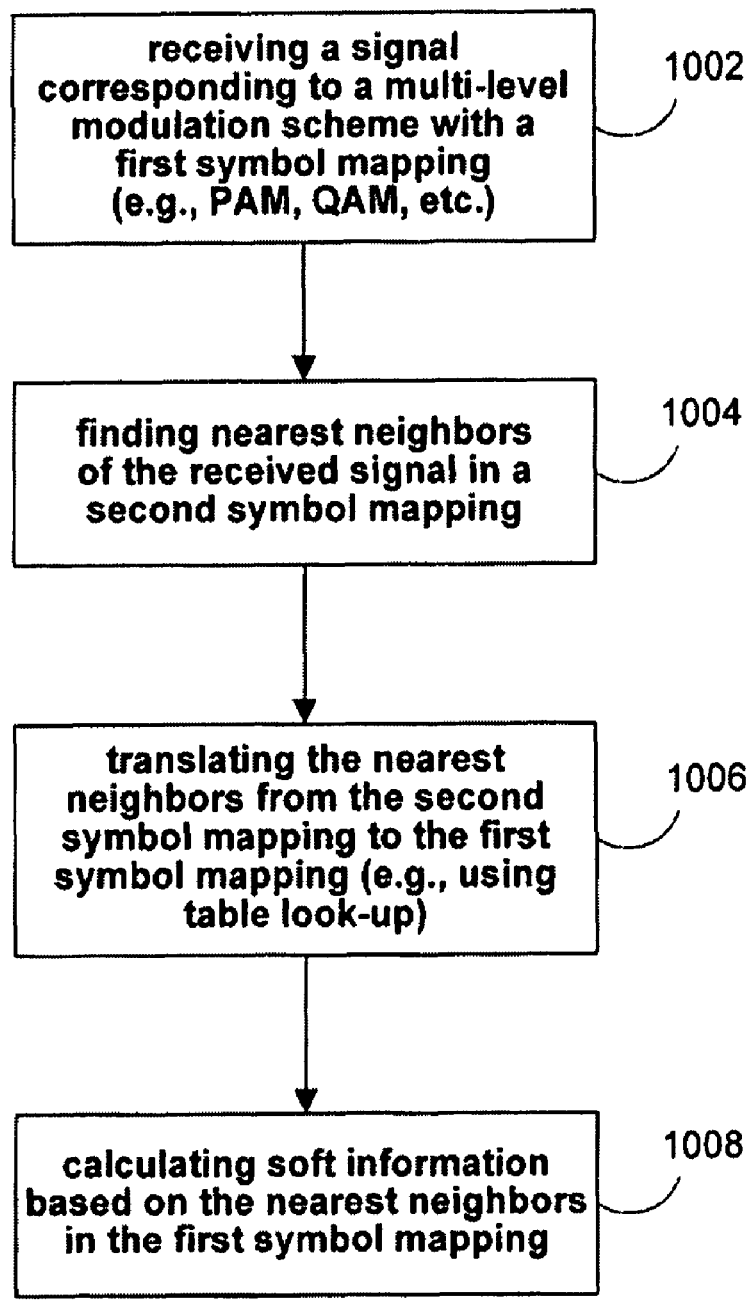
FIG. 10 shows an illustrative flow diagram for calculating soft information in a multi-level modulation scheme.

Referring now to FIG. 10, illustrative flow diagram 1000 is shown for calculating soft information in a multi-level modulation system in accordance with an embodiment of the present invention. At step 1002, a signal corresponding to a multi-level modulation scheme with a first symbol mapping is preferably received. The signal may be received from a modulator that modulates digital information according to flow diagram 900 of FIG. 9. Thus, the received signal may be a noisy version of a transmitted signal modulated according to a multi-level signal constellation set, such as a PAM, QAM, or PSK signal set with a suitable number of levels. The symbol mapping of the signal constellation set, or the first symbol mapping, may be chosen to maximize system performance. In some embodiments, the first symbol mapping may be a Gray code mapping or a quasi-Gray code mapping.

After the signal is received, the nearest neighbors of the received signal can be found at step 1004. In particular, one or more signal points of the signal constellation set can be chosen based on their distance from the received signal. In order to find the nearest neighbors using low complexity and low power computations, the nearest neighbors are preferably calculated assuming the signal points correspond to a second symbol mapping. The second symbol mapping may be, for example, a natural labeling or a two's complement mapping. Thus, there may be an inherent and logical ordering of the symbols in the second symbol mapping that allows for less complicated computations when finding nearest neighbors. Finding nearest neighbors using a second symbol mapping is discussed in greater detail below in connection with flow diagrams 1100 and 1200 of FIGS. 11 and 12, respectively.

At step 1006 in flow diagram 1000 (FIG. 10), the nearest neighbors found in step 1006 can be translated to symbols of the first symbol mapping. That is, the signal points closest the received signal can be converted back into the first symbol mapping that was actually used by the modulator (e.g., modulator 104 in FIG. 1). The translation may be performed using, for example, a table lookup from memory, or a combination logic, or a combination of memory and logic. Then, using the nearest neighbors in the first symbol mapping, soft information is preferably calculated for the original digital information sequence (e.g., digital information 102 of FIG. 1). The soft information may be in the form of log-likelihood ratios (LLRs) for each bit in the digital information sequence, and can be calculated using any of equations (2) through equation (9).

Figure 11:
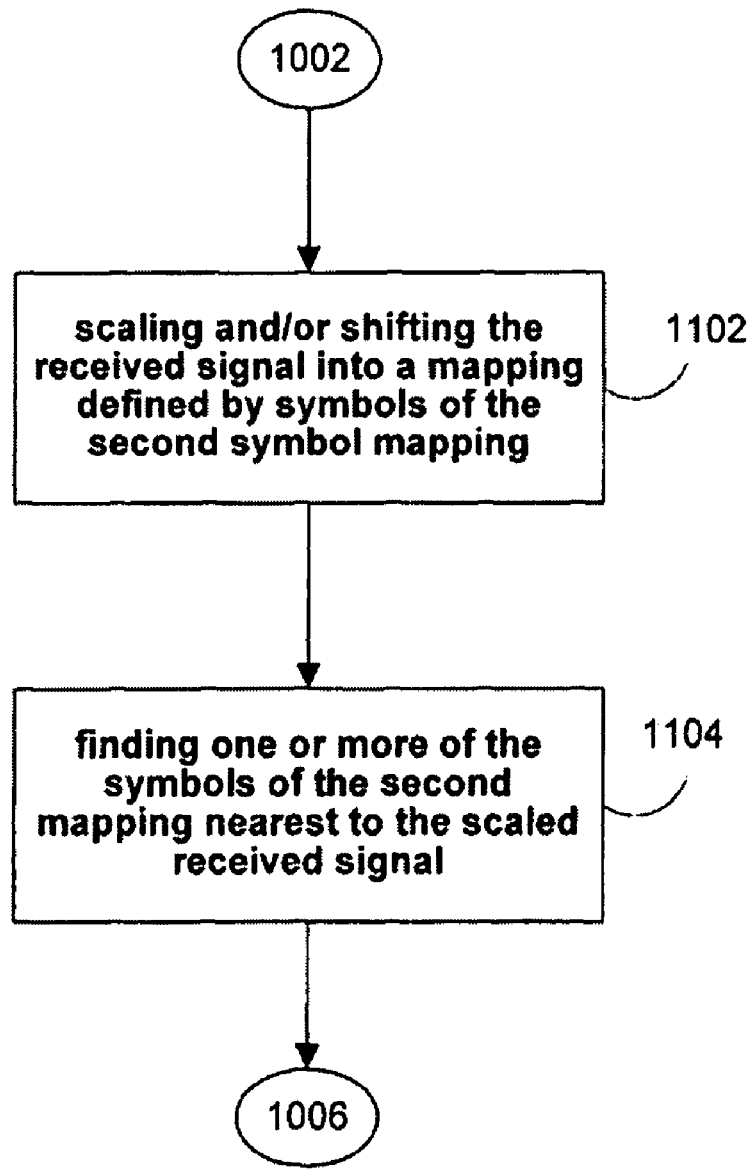
FIG. 11 shows an illustrative flow diagram for finding nearest neighbors in a uniformly distributed signal constellation set.

Referring now to FIG. 11, illustrative flow diagram 1100 is shown for finding nearest neighbors in a second mapping in accordance with an embodiment of the present invention. The second symbol mapping can be, for example, a natural labeling or two's complement labeling, and can therefore logically correspond to the values of the signal points in the constellation set. At step 1102, a received signal (e.g., received from step 1002 of FIG. 10) is preferably scaled by a scaling factor. The scaling factor is preferably based on the value (e.g., amplitude and phase) of the signal points in the signal constellation set and on the bit value of the symbols. In some embodiments, the received signal may be scaled by a ratio of the symbol bit value to the signal point values. Thus, the received signal may be scaled such that its scaled value corresponds to the bit values of the symbols in the second symbol mapping. In some embodiments, the received signal can also be shifted by a shifting factor by adding or subtracting an integer from the received signal.

Using the scaled and/or shifted received signal, at step 1104 one or more symbols of the second symbol mapping can be found that are closest in Euclidean distance to the scaled received signal. Finding one or more closest symbols may involve performing rounding functions, such as ceiling and floor functions. If additional nearest neighbors are desired, finding these additional nearest neighbors may involve adding or subtracting integers from the nearest neighbor symbols that have already been found. In some embodiments, if a multi-dimensional signal constellation set is used, finding one or more closest symbols may involve considering each dimension separately. In particular, for a 2D signal constellation set with a real and an imaginary axis, theses axes may be considered separately to find the real components of the nearest neighbors and the imaginary components of the nearest neighbors. The real and imaginary components are then preferably combined to reveal the complete, complex nearest neighbors of the received signal.

The nearest neighbors found in step 1104 using the second symbol mapping may be translated to symbols in the first symbol mapping, as specified by step 1004 of flow diagram 1000 (FIG. 10), and used to calculate soft information, as specified by step 1006 of flow diagram 1000.

It should be understood that flow diagram 1100 of FIG. 11 is merely illustrative. Any of the steps in flow diagram 1100 may be modified or rearranged, and any additional components may be added, without departing from the scope of the scope of the invention.

Figure 12:
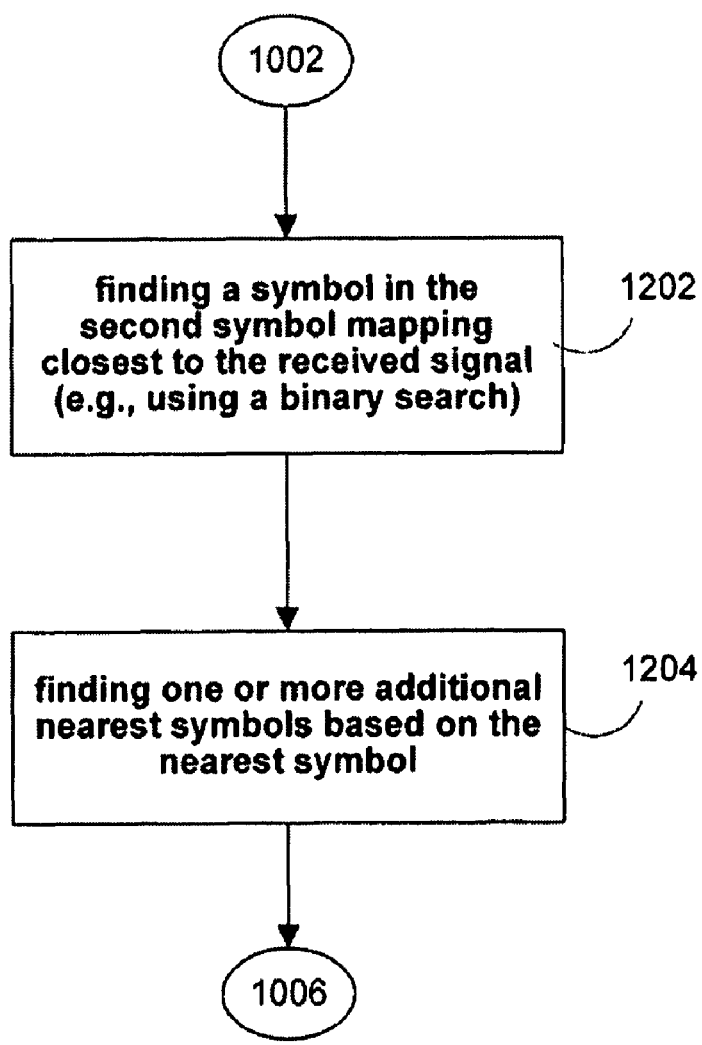
FIG. 12 shows an illustrative flow diagram for finding nearest neighbors in a non-uniformly distributed signal constellation set.

Referring now to FIG. 12, illustrative flow diagram 1200 is shown with a different approach for finding nearest neighbors in a second symbol mapping in accordance with another embodiment of the present invention. At step 1202, a symbol with a signal point closest to the magnitude and phase of a received signal (e.g., received from step 1002 of FIG. 10) is found. The symbol preferably corresponds to a second symbol mapping that is not the same as the mapping used to generate the received signal. The closest signal point, and therefore the closest symbol, is preferably found using a search algorithm such as a binary search. Using a binary search, signal points/symbols can be systematically discarded until a single signal point/symbol that corresponds to the closest signal point/symbol remains. In some embodiments, if multiple signal points are desired, the search algorithm can terminate before completion when it has found the desired number of closest signal points. A search algorithm, such as a binary search, can find the closest symbol or symbols even if the signal points in the signal constellation set are not uniformly distributed.

In some embodiments, when signal constellation sets with multiple dimensions are used, a search algorithm (e.g., a binary search) may be performed for each dimension to find the nearest component in each dimension.

From the closest symbol, and using information obtained from the binary search (or other search algorithm), one or more additional nearest symbols can be found at step 1204. In some embodiments of the present invention, an integer can be added or subtracted from the closest symbol to find a second closest symbol based on whether the closest symbol has a signal point greater than or less than the magnitude of the received signal. Further integers can be added or subtracted from these nearest symbols if additional nearest neighbors are desired. For signal constellations with multiple dimensions, for each dimension, one or more additional nearest components may be found using any of the above-described techniques. The resulting nearest components for each dimension are preferably combined to reveal the nearest neighbors.

The nearest neighbors found in step 1204 using the second symbol mapping may be translated to symbols in the first symbol mapping, as specified by step 1004 of flow diagram 1000 (FIG. 10), and used to calculate soft information, as specified by step 1006 of flow diagram 1000.

It should be understood that flow diagram 1200 of FIG. 12 is merely illustrative. Any of the steps in flow diagram 1200 may be modified or rearranged, and any additional components may be added, without departing from the scope of the scope of the invention.

Referring now to FIGS. 13A-13H, various exemplary implementations of the present invention are shown.

Figure 13A:
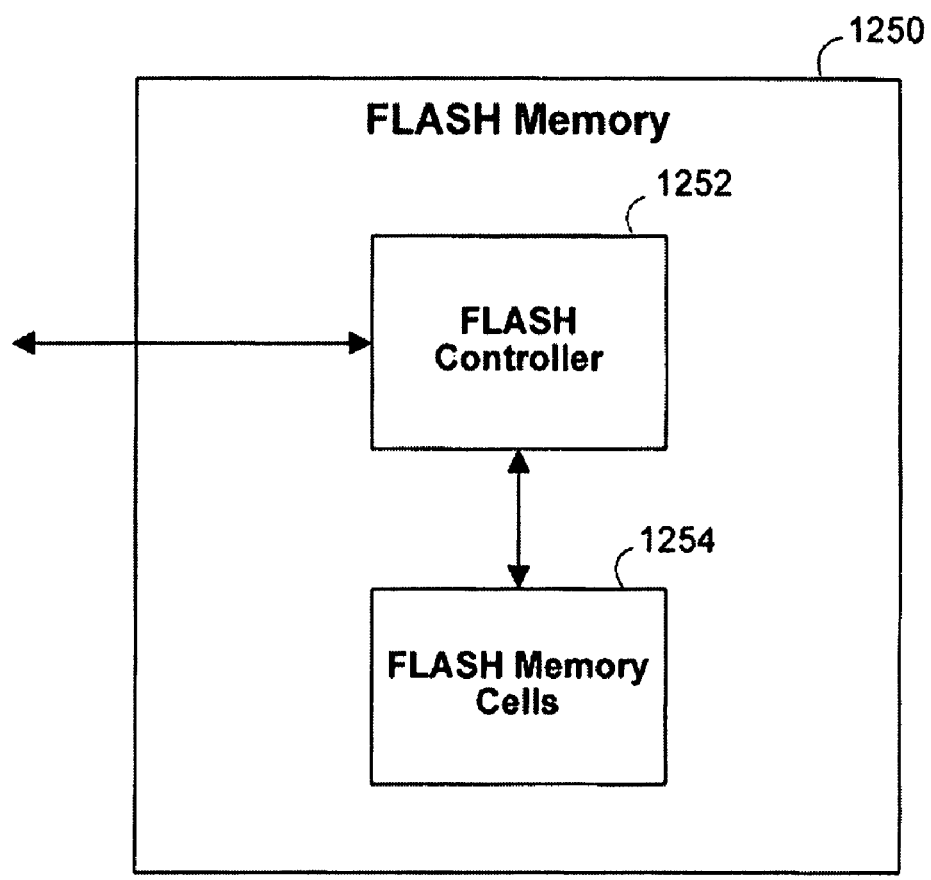
FIG. 13A is a block diagram of an exemplary FLASH memory that can employ the disclosed technology.

Referring now to FIG. 13A, FLASH memory 1250 shows one system that the present invention may be implemented in. In some embodiments, FLASH memory 1250 with the disclosed technology can be included as part of any of the memory components in FIGS. 13B-13H (described below). The present invention may be implemented as part of a FLASH controller, which is generally identified in FIG. 13A at 1252. FLASH controller 1252 can control (e.g., access, modify, etc.) any digital information stored in FLASH memory 1250, and can communicate with other components or devices to provide or store information. FLASH memory 1250 can also include FLASH memory cells 1254 for storing the digital information. FLASH memory cells 1254 may include any suitable circuitry for storing digital information, such as any transistor-based storage units. In some embodiments, FLASH memory cells 1254 can store each received signal, such as received signal 110 of FIG. 1. In some embodiments, FLASH controller 1252 and FLASH memory cells 1254 can be implemented in the same package. Alternatively, they may be implemented in separate packages.

Figure 13B:
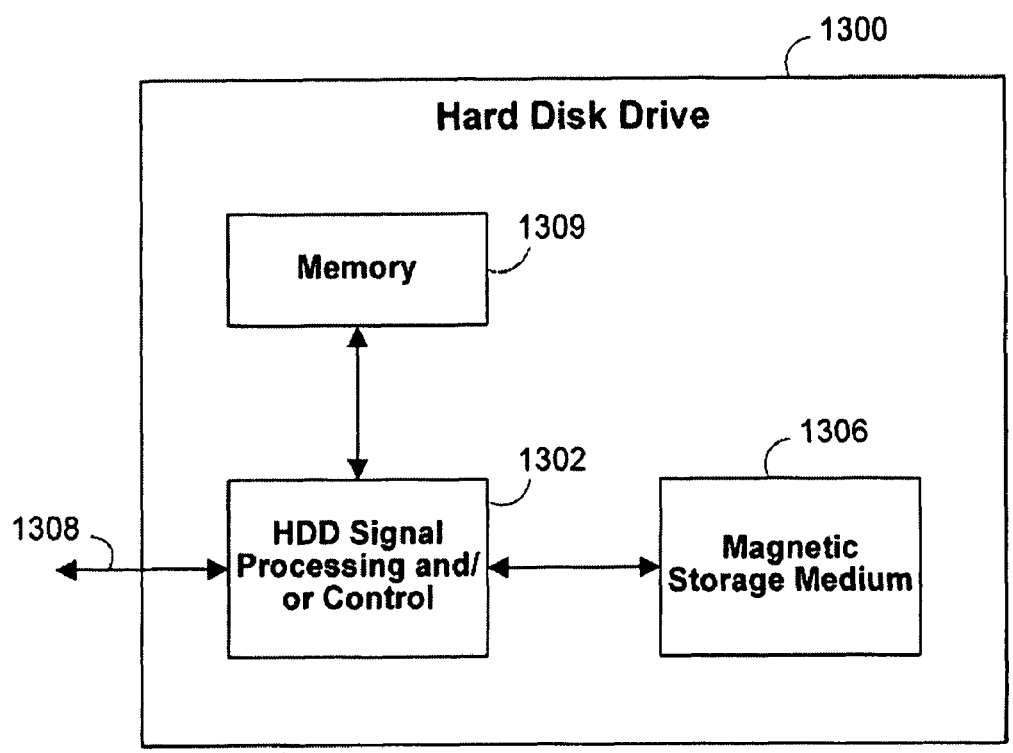
FIG. 13B is a block diagram of an exemplary hard disk drive that can employ the disclosed technology.

Referring now to FIG. 13B, the present invention can be implemented in a hard disk drive 1300. The present invention may implement either or both signal processing and/or control circuits, which are generally identified in FIG. 13B at 1302. In some implementations, the signal processing and/or control circuit 1302 and/or other circuits (not shown) in the HDD 1300 may process data, perform coding and/or encryption, perform calculations, and/or format data that is output to and/or received from a magnetic storage medium 1306.

The HDD 1300 may communicate with a host device (not shown) such as a computer, mobile computing devices such as personal digital assistants, cellular phones, media or MP3 players and the like, and/or other devices via one or more wired or wireless communication links 1308. The HDD 1300 may be connected to memory 1309 such as random access memory (RAM), low latency nonvolatile memory such as flash memory, read only memory (ROM) and/or other suitable electronic data storage.

Figure 13C:
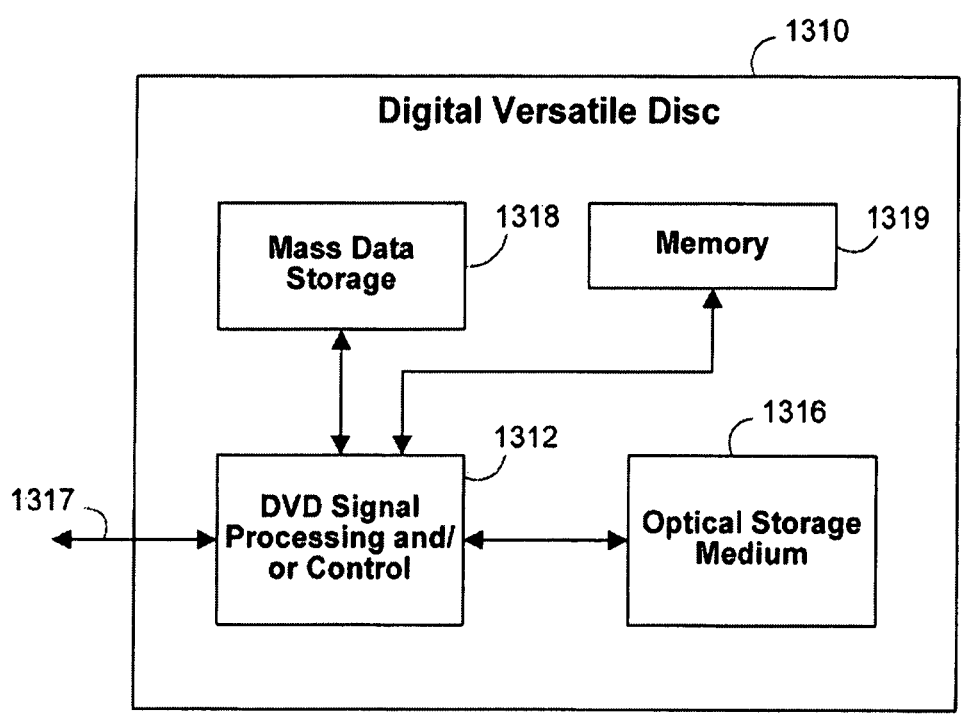
FIG. 13C is a block diagram of an exemplary digital versatile disc that can employ the disclosed technology.

Referring now to FIG. 13C, the present invention can be implemented in a digital versatile disc (DVD) drive 1310. The present invention may implement either or both signal processing and/or control circuits, which are generally identified in FIG. 13C at 1312, and/or mass data storage of the DVD drive 1310. The signal processing and/or control circuit 1312 and/or other circuits (not shown) in the DVD 1310 may process data, perform coding and/or encryption, perform calculations, and/or format data that is read from and/or data written to an optical storage medium 1316. In some implementations, the signal processing and/or control circuit 1312 and/or other circuits (not shown) in the DVD 1310 can also perform other functions such as encoding and/or decoding and/or any other signal processing functions associated with a DVD drive.

The DVD drive 1310 may communicate with an output device (not shown) such as a computer, television or other device via one or more wired or wireless communication links 1317. The DVD 1310 may communicate with mass data storage 1318 that stores data in a nonvolatile manner. The mass data storage 1318 may include a hard disk drive (HDD). The HDD may have the configuration shown in FIG. 13B. The HDD may be a mini HDD that includes one or more platters having a diameter that is smaller than approximately 1.8". The DVD 1310 may be connected to memory 1319 such as RAM, ROM, low latency nonvolatile memory such as flash memory and/or other suitable electronic data storage.

Figure 13D:
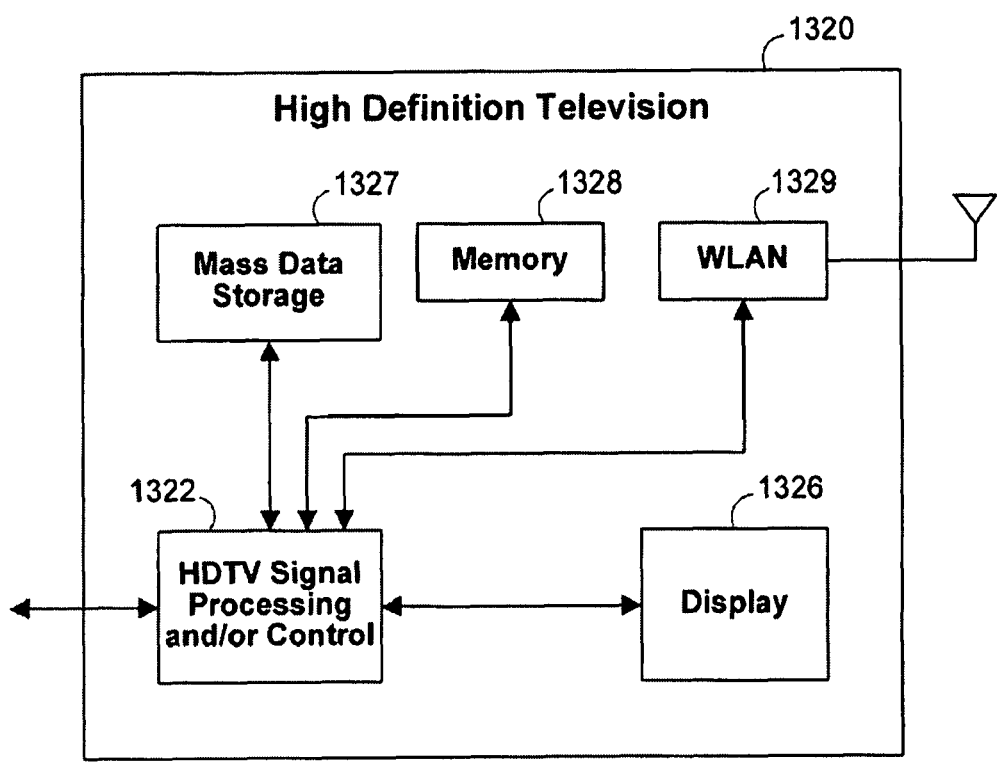
FIG. 13D is a block diagram of an exemplary high definition television that can employ the disclosed technology.

Referring now to FIG. 13D, the present invention can be implemented in a high definition television (HDTV) 1320. The present invention may implement either or both signal processing and/or control circuits, which are generally identified in FIG. 13D at 1322, a WLAN interface and/or mass data storage of the HDTV 1320. The HDTV 1320 receives HDTV input signals in either a wired or wireless format and generates HDTV output signals for a display 1326. In some implementations, signal processing circuit and/or control circuit 1322 and/or other circuits (not shown) of the HDTV 1320 may process data, perform coding and/or encryption, perform calculations, format data and/or perform any other type of HDTV processing that may be required.

The HDTV 1320 may communicate with mass data storage 1327 that stores data in a nonvolatile manner such as optical and/or magnetic storage devices for example hard disk drives HDD and/or DVDs. At least one HDD may have the configuration shown in FIG. 13B and/or at least one DVD may have the configuration shown in FIG. 13C. The HDD may be a mini HDD that includes one or more platters having a diameter that is smaller than approximately 1.8". The HDTV 1320 may be connected to memory 1328 such as RAM, ROM, low latency nonvolatile memory such as flash memory and/or other suitable electronic data storage. The HDTV 1320 also may support connections with a WLAN via a WLAN network interface 1329.

Figure 13E:
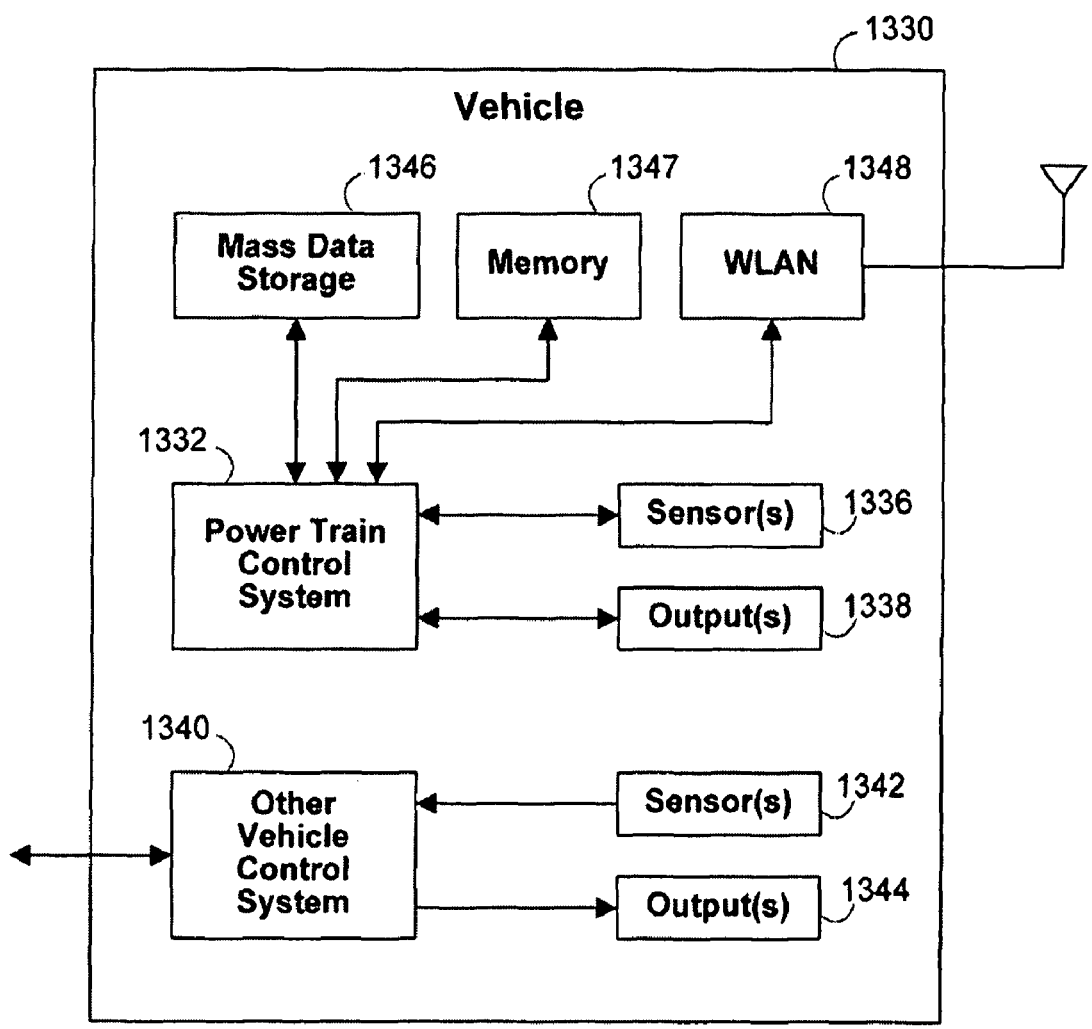
FIG. 13E is a block diagram of an exemplary vehicle that can employ the disclosed technology.

Referring now to FIG. 13E, the present invention implements a control system of a vehicle 1330, a WLAN interface and/or mass data storage of the vehicle control system. In some implementations, the present invention may implement a powertrain control system 1332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1340 of the vehicle 1330. The control system 1340 may likewise receive signals from input sensors 1342 and/or output control signals to one or more output devices 1344. In some implementations, the control system 1340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1332 may communicate with mass data storage 1346 that stores data in a nonvolatile manner. The mass data storage 1046 may include optical and/or magnetic storage devices for example hard disk drives HDD and/or DVDs. At least one HDD may have the configuration shown in FIG. 13B and/or at least one DVD may have the configuration shown in FIG. 13C. The HDD may be a mini HDD that includes one or more platters having a diameter that is smaller than approximately 1.8". The powertrain control system 1332 may be connected to memory 1347 such as RAM, ROM, low latency nonvolatile memory such as flash memory and/or other suitable electronic data storage. The powertrain control system 1332 also may support connections with a WLAN via a WLAN network interface 1348. The control system 1340 may also include mass data storage, memory and/or a WLAN interface (all not shown).

Figure 13F:
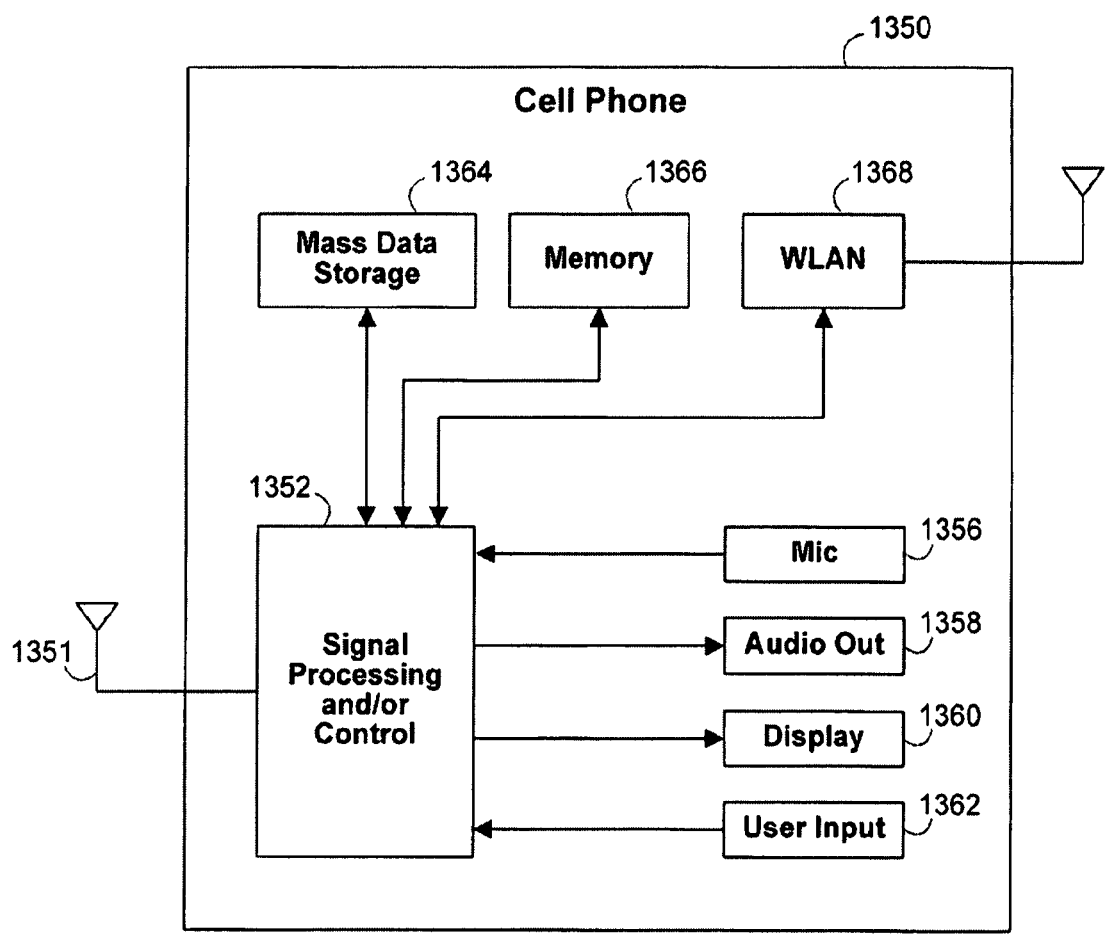
FIG. 13F is a block diagram of an exemplary cell phone that can employ the disclosed technology.

Referring now to FIG. 13F, the present invention can be implemented in a cellular phone 1350 that may include a cellular antenna 1351. The present invention may implement either or both signal processing and/or control circuits, which are generally identified in FIG. 13F at 1352, a WLAN interface and/or mass data storage of the cellular phone 1350. In some implementations, the cellular phone 1350 includes a microphone 1356, an audio output 1358 such as a speaker and/or audio output jack, a display 1360 and/or an input device 1362 such as a keypad, pointing device, voice actuation and/or other input device. The signal processing and/or control circuits 1352 and/or other circuits (not shown) in the cellular phone 1350 may process data, perform coding and/or encryption, perform calculations, format data and/or perform other cellular phone functions.

The cellular phone 1350 may communicate with mass data storage 1364 that stores data in a nonvolatile manner such as optical and/or magnetic storage devices for example hard disk drives HDD and/or DVDs. At least one HDD may have the configuration shown in FIG. 13B and/or at least one DVD may have the configuration shown in FIG. 13C. The HDD may be a mini HDD that includes one or more platters having a diameter that is smaller than approximately 1.8". The cellular phone 1350 may be connected to memory 1366 such as RAM, ROM, low latency nonvolatile memory such as flash memory and/or other suitable electronic data storage. The cellular phone 1350 also may support connections with a WLAN via a WLAN network interface 1368.

Figure 13G:
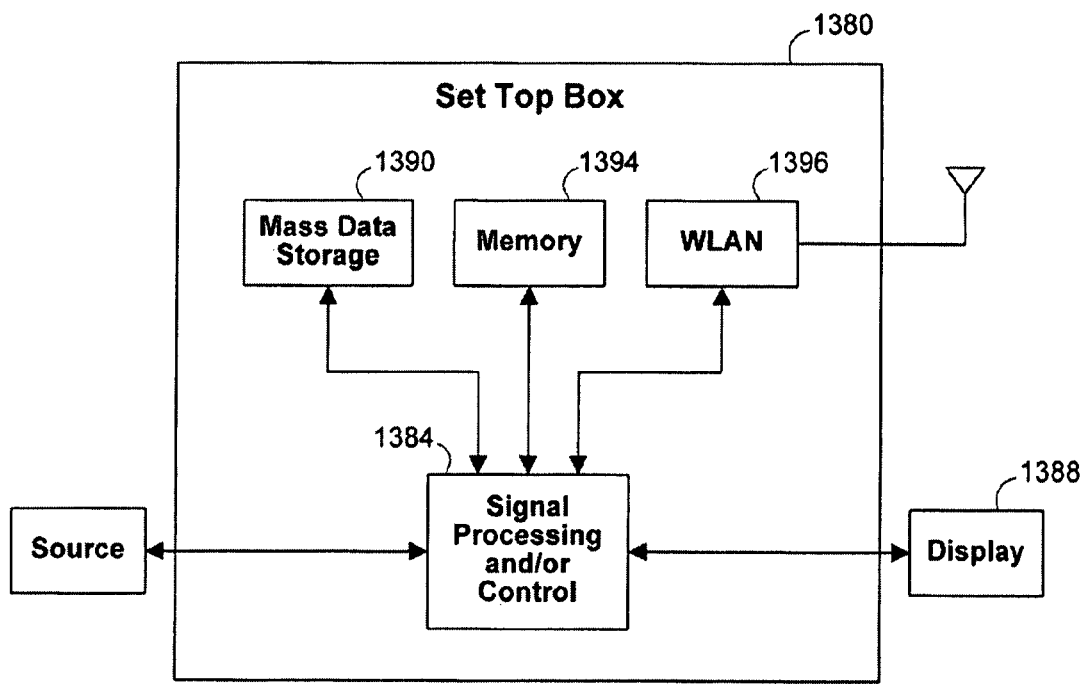
FIG. 13G is a block diagram of an exemplary set top box that can employ the disclosed technology.

Referring now to FIG. 13G, the present invention can be implemented in a set top box 1380. The present invention may implement either or both signal processing and/or control circuits, which are generally identified in FIG. 13G at 1384, a WLAN interface and/or mass data storage of the set top box 1380. The set top box 1380 receives signals from a source such as a broadband source and outputs standard and/or high definition audio/video signals suitable for a display 1388 such as a television and/or monitor and/or other video and/or audio output devices. The signal processing and/or control circuits 1384 and/or other circuits (not shown) of the set top box 1380 may process data, perform coding and/or encryption, perform calculations, format data and/or perform any other set top box function.

The set top box 1380 may communicate with mass data storage 1390 that stores data in a nonvolatile manner. The mass data storage 1390 may include optical and/or magnetic storage devices for example hard disk drives HDD and/or DVDs. At least one HDD may have the configuration shown in FIG. 13B and/or at least one DVD may have the configuration shown in FIG. 13C. The HDD may be a mini HDD that includes one or more platters having a diameter that is smaller than approximately 1.8". The set top box 1380 may be connected to memory 1394 such as RAM, ROM, low latency nonvolatile memory such as flash memory and/or other suitable electronic data storage. The set top box 1380 also may support connections with a WLAN via a WLAN network interface 1396.

Figure 13H:
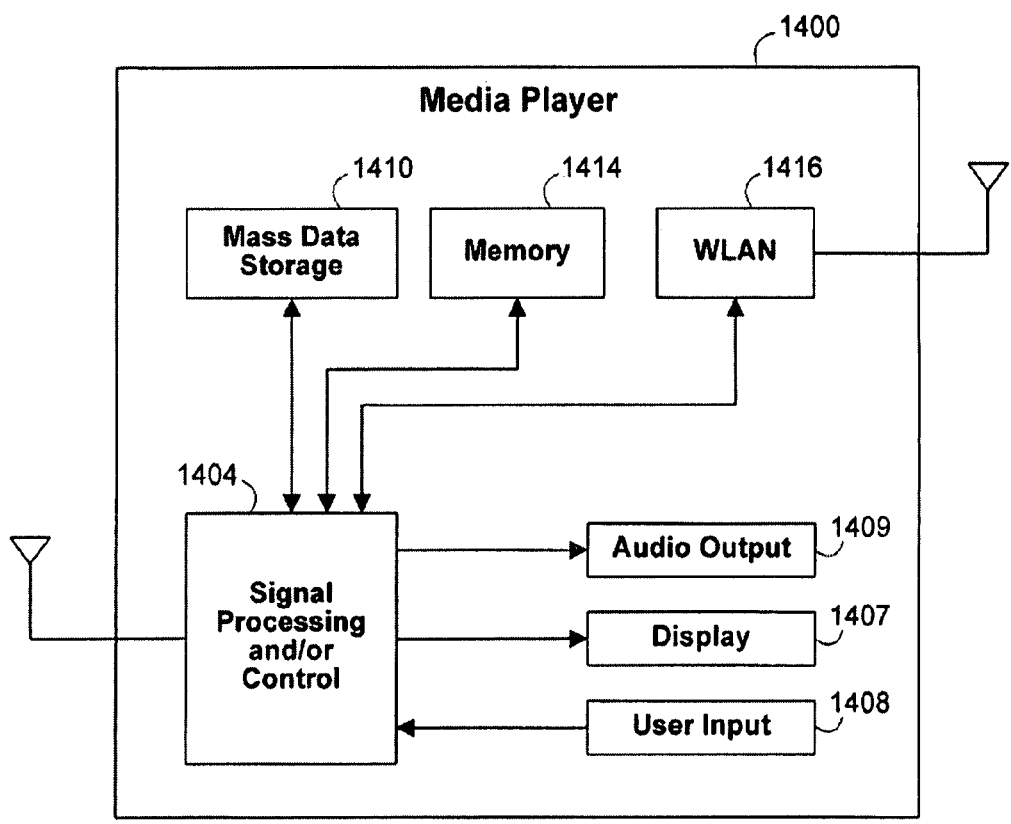
FIG. 13H is a block diagram of an exemplary media player that can employ the disclosed technology.

Referring now to FIG. 13H, the present invention can be implemented in a media player 1460. The present invention may implement either or both signal processing and/or control circuits, which are generally identified in FIG. 13H at 1354, a WLAN interface and/or mass data storage of the media player 1350. In some implementations, the media player 1350 includes a display 1407 and/or a user input 1408 such as a keypad, touchpad and the like. In some implementations, the media player 1350 may employ a graphical user interface (GUI) that typically employs menus, drop down menus, icons and/or a point-and-click interface via the display 1407 and/or user input 1408. The media player 1350 further includes an audio output 1409 such as a speaker and/or audio output jack. The signal processing and/or control circuits 1354 and/or other circuits (not shown) of the media player 1350 may process data, perform coding and/or encryption, perform calculations, format data and/or perform any other media player function.

The media player 1350 may communicate with mass data storage 1410 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13B and/or at least one DVD may have the configuration shown in FIG. 13C. The HDD may be a mini HDD that includes one or more platters having a diameter that is smaller than approximately 1.8". The media player 1350 may be connected to memory 1414 such as RAM, ROM, low latency nonvolatile memory such as flash memory and/or other suitable electronic data storage. The media player 1350 also may support connections with a WLAN via a WLAN network interface 1416. Still other implementations in addition to those described above are contemplated.

The foregoing describes systems and methods for finding the nearest neighbors of a received signal for calculating soft information in a multi-level modulation scheme. Those skilled in the art will appreciate that the invention can be practiced by other than the described embodiments, which are presented for the purpose of illustration rather than of limitation.

What is claimed is:

1. A method for finding nearest neighbors with a first symbol mapping to a multi-level signal constellation set during processing of a received signal derived from the signal constellation set for use in estimating a digital information sequence from the received signal, the method comprising:
   finding nearest neighbors in a second symbol mapping to the signal constellation set; and
   mapping symbols of the nearest neighbors in the second symbol mapping to the signal constellation set to symbols in the first symbol mapping to the multi-level signal constellation set.

2. The method of claim 1 wherein the multilevel signal constellation set comprises a plurality of signal points, wherein each signal point represents a magnitude and/or phase of a signal corresponding to a particular symbol.

3. The method of claim 2 wherein the nearest neighbors comprise at least one signal point closest to a magnitude and/or phase of the received signal.

4. The method of claim 1 wherein the first and second symbol mapping to the signal constellation set each provide a distinct symbol for at least one signal point in the signal constellation set.

5. The method of claim 1, further comprising computing soft information for the digital information sequence using the symbols in the first symbol mapping to the signal constellation set mapped from the second symbol mapping to the signal constellation set.

6. The method of claim 1 wherein the first symbol mapping to the signal constellation set and the second symbol mapping to the signal constellation set use a different number of bits per symbol.

7. The method of claim 1 wherein the first symbol mapping to the signal constellation set comprises a Gray code mapping and the second symbol mapping to the signal constellation set comprises a natural labeling.

8. A method of calculating soft information in a multi-level modulation scheme, the method comprising:
receiving a signal corresponding to a first symbol mapping to a multi-level signal constellation set;
finding nearest neighbors of the received signal in a second symbol mapping to the signal constellation set;
translating the nearest neighbors from the second symbol mapping to the signal constellation set to the first symbol mapping to the signal constellation set; and
calculating soft information based on the nearest neighbors in the first symbol mapping to the multi-level signal constellation set.

9. The method of claim 8 wherein the first symbol mapping to the signal constellation set is a Gray code mapping or a quasi-Gray code mapping.

10. The method of claim 8 wherein the first symbol mapping to the signal constellation set is chosen to minimize bit error rate.

11. The method of claim 8 wherein the multilevel modulation scheme corresponds to a multi-level signal constellation set.

12. The method of claim 11 wherein the multilevel constellation set comprises a pulse amplitude modulation (PAM) constellation set or a quadrature amplitude modulation (QAM) constellation set.

13. The method of claim 11 wherein the nearest neighbors comprise at least one signal point in the multi-level constellation set closest to the received signal.

14. The method of claim 11 wherein the signal constellation set is multi-dimensional, and wherein finding nearest neighbors comprises processing each dimension separately to find nearest components of the received signal.

15. The method of claim 14, further comprising combining the nearest components to obtain nearest neighbors in the second symbol mapping to the signal constellation set.

16. The method of claim 8 wherein the second symbol mapping to the signal constellation set labels each signal point with a symbol that is related to a value of that signal point.

17. The method of claim 16 wherein the second symbol mapping to the signal constellation set is a natural labeling or a two's complement labeling.

18. The method of claim 8, further comprising scaling the received signal by a scaling factor.

19. The method of claim 18 wherein the scaling factor is based on a symbol bit-value in the second symbol mapping to the signal constellation set and a signal magnitude corresponding to the symbol.

20. The method of claim 8 wherein finding the nearest neighbors comprises computing a floor and ceil function.

21. The method of claim 20, further comprising adding or subtracting integers from the nearest neighbors to find additional nearest neighbors.

22. The method of claim 8 wherein finding the nearest neighbors comprises performing a search algorithm to find a symbol with a signal point closest to a value of the received signal.

23. The method of claim 22 wherein the search algorithm is a binary search.

24. The method of claim 8 wherein translating the nearest neighbors comprises a table lookup.

25. The method of claim 8 wherein calculating soft information comprises calculating a log-likelihood ratio (LLR) for each bit of a digital information sequence.

26. The method of claim 25 wherein calculating log-likelihood ratios comprises computing LLRs using only the nearest neighbors in the second symbol mapping to the signal constellation set.

27. The method of claim 8, further comprising providing the soft information to a decoder for an error correcting code.

28. The method of claim 27 wherein the decoder is an LDPC decoder.

29. Apparatus for finding nearest neighbors with a first symbol mapping to a multi-level signal constellation set during processing of a received signal derived from the signal constellation set for use in estimating a digital information sequence from the received signal, the apparatus comprising:
means for finding nearest neighbors in a second symbol mapping to the signal constellation set; and
means for mapping symbols of the nearest neighbors in the second symbol mapping to the signal constellation set to symbols in the first symbol mapping to the multi-level signal constellation set.

30. The apparatus of claim 29 wherein the multi-level signal constellation set comprises a plurality of signal points, wherein each signal point represents a magnitude and/or phase of a signal corresponding to a particular symbol.

31. The apparatus of claim 30 wherein the nearest neighbors comprise at least one signal point closest to a magnitude and/or phase of the received signal.

32. The apparatus of claim 29 wherein the first and second symbol mapping to the signal constellation set each provide a distinct symbol for at least one signal point in the signal constellation set.

33. The apparatus of claim 29, further comprising means for computing soft information for the digital information sequence using the symbols in the first symbol mapping to the signal constellation set mapped from the second symbol mapping to the signal constellation set.

34. The apparatus of claim 29 wherein the first symbol mapping to the signal constellation set and the second symbol mapping to the signal constellation set use a different number of bits per symbol.

35. The apparatus of claim 29 wherein the first symbol mapping to the signal constellation set comprises a Gray code mapping and the second symbol mapping to the signal constellation set comprises a natural labeling.

36. Apparatus for calculating soft information in a multi-level modulation scheme, the apparatus comprising:
means for receiving a signal corresponding to a first symbol mapping to a multi-level signal constellation set;

means for finding nearest neighbors of the received signal in a second symbol mapping to the signal constellation set;

means for translating the nearest neighbors from the second symbol mapping to the signal constellation set to the first symbol mapping to the multi-level signal constellation set; and means for calculating soft information based on the nearest neighbors in the first symbol mapping to the signal constellation set.

37. The apparatus of claim 36 wherein the first symbol mapping to the signal constellation set is a Gray code mapping or a quasi-Gray code mapping.

38. The apparatus of claim 36 wherein the first symbol mapping to the signal constellation set is chosen to minimize bit error rate.

39. The apparatus of claim 36 wherein the multi-level modulation scheme corresponds to a multilevel signal constellation set.

40. The apparatus of claim 39 wherein the multi-level constellation set comprises a pulse amplitude modulation (PAM) constellation set or a quadrature amplitude modulation (QAM) constellation set.

41. The apparatus of claim 39 wherein the nearest neighbors comprise at least one signal point in the multi-level constellation set closest to a value of the received signal.

42. The apparatus of claim 39 wherein the signal constellation set is multi-dimensional, and wherein means for finding nearest neighbors comprises means for processing each dimension separately to find nearest components of the received signal.

43. The apparatus of claim 42, further comprising means for combining the nearest components to obtain nearest neighbors in the second symbol mapping to the signal constellation set.

44. The apparatus of claim 36 wherein the second symbol mapping to the signal constellation set labels each signal point with a symbol that is related to a value of that signal point.

45. The apparatus of claim 44 wherein the second symbol mapping to the signal constellation set is a natural labeling or a two's complement labeling.

46. The apparatus of claim 36, further comprising means for scaling the received signal by a scaling factor.

47. The apparatus of claim 46 wherein the scaling factor is based on a symbol bit-value in the second symbol mapping to the signal constellation set and a signal magnitude corresponding to the symbol.

48. The apparatus of claim 36 wherein means for finding the nearest neighbors comprises means for computing a floor and ceil function.

49. The apparatus of claim 48, further comprising means for adding or subtracting integers from the nearest neighbors to find additional nearest neighbors.

50. The apparatus of claim 36 wherein means for finding the nearest neighbors comprises means for performing a search algorithm to find a symbol with a signal point closest to a value of the received signal.

51. The apparatus of claim 50 wherein the search algorithm is a binary search.

52. The apparatus of claim 36 wherein means for translating the nearest neighbors comprises means for performing a table lookup.

53. The apparatus of claim 36 wherein means for calculating soft information comprises calculating a log-likelihood ratio (LLR) for each bit of a digital information sequence.

54. The apparatus of claim 53 wherein means for calculating log-likelihood ratios comprises means for computing LLRs using only the nearest neighbors in the second symbol mapping to the signal constellation set.

55. The apparatus of claim 36, further comprising means for providing the soft information to a decoder for an error correcting code.

56. The apparatus of claim 55 wherein the decoder comprises means for LDPC decoding.

57. A detector for finding nearest neighbors with a first symbol mapping to a multi-level signal constellation set during processing of a received signal derived from the signal constellation set for use in estimating a digital information sequence from the received signal, the detector comprising:

a symbol selection unit for finding nearest neighbors in a second symbol mapping to the signal constellation set; and a translation unit for mapping symbols of the nearest neighbors in the second symbol mapping to the signal constellation set to symbols in the first symbol mapping to the multi-level signal constellation set.

58. The apparatus of claim 57 wherein the multi-level signal constellation set comprises a plurality of signal points, wherein each signal point represents a magnitude and/or phase of a signal corresponding to a particular symbol.

59. The detector of claim 58 wherein the nearest neighbors comprise at least one signal point closest to a magnitude and/or phase of the received signal.

60. The detector of claim 57 wherein the first and second symbol mapping to the signal constellation set each provide a distinct symbol for at least one signal point in the signal constellation set.

61. The detector of claim 57, further comprising an LLR computation unit that computes soft information for the digital information sequence using the symbols in the first symbol mapping to the signal constellation set mapped from the second symbol mapping to the signal constellation set.

62. The detector of claim 57 wherein the first symbol mapping to the signal constellation set and the second symbol mapping to the signal constellation set use a different number of bits per symbol.

63. The detector of claim 57 wherein the first symbol mapping to the signal constellation set comprises a Gray code mapping and the second symbol mapping to the signal constellation set comprises a natural labeling.

64. A detector for calculating soft information in a multi-level modulation scheme, the detector comprising:

a receiver for receiving a signal corresponding to a first symbol mapping to a multi-level signal constellation set;

a symbol selection unit for finding nearest neighbors of the received signal in a second symbol mapping to the signal constellation set;

a translation unit for translating the nearest neighbors from the second symbol mapping to the signal constellation set to the first symbol mapping to the multi- level signal constellation set; and an LLR computation unit for calculating soft information based on the nearest neighbors in the first symbol mapping to the signal constellation set.

65. The detector of claim 64 wherein the first symbol mapping to the signal constellation set is a Gray code mapping or a quasi-Gray code mapping.

66. The detector of claim 64 wherein the first symbol mapping to the signal constellation set is chosen to minimize bit error rate.

67. The detector of claim 64 wherein the multi-level modulation scheme corresponds to a multilevel signal constellation set.

68. The detector of claim 67 wherein the multi-level constellation set comprises a pulse amplitude modulation (PAM) constellation set or a quadrature amplitude modulation (QAM) constellation set.

69. The detector of claim 67 wherein the nearest neighbors comprise at least one signal point in the multi-level constellation set closest to a value of the received signal.

70. The detector of claim 67 wherein the signal constellation set is multi-dimensional, and wherein the symbol selection unit comprises processing circuitry for processing each dimension separately to find nearest components of the received signal.

71. The detector of claim 70, further comprising combining circuitry for combining the nearest components to obtain nearest neighbors in the second symbol mapping to the signal constellation set.

72. The detector of claim 64 wherein the second symbol mapping to the signal constellation set labels each signal point with a symbol that is related to a value of that signal point.

73. The detector of claim 72 wherein the second symbol mapping to the signal constellation set is a natural labeling or a two's complement labeling.

74. The detector of claim 64, further comprising a scaling unit for scaling the received signal by a scaling factor.

75. The detector of claim 74 wherein the scaling factor is based on a symbol bit-value in the second symbol mapping to the signal constellation set and a signal magnitude corresponding to the symbol.

76. The detector of claim 64 wherein the symbol selection unit comprises rounding circuitry for computing a floor and ceil function.

77. The detector of claim 76 wherein the rounding circuitry further comprises circuitry for adding or subtracting integers from the nearest neighbors to find additional nearest neighbors.

78. The detector of claim 64 wherein the symbol selection unit comprises a searching unit for performing a search algorithm to find a symbol with a signal point closest to a value of the received signal.

79. The detector of claim 78 wherein the search algorithm is a binary search.

80. The detector of claim 64 wherein the translation unit comprises memory for performing a table lookup.

81. The detector of claim 64 wherein the LLR computation unit comprises computation circuitry for calculating a log-likelihood ratio (LLR) for each bit of a digital information sequence.

82. The detector of claim 81 wherein the computation circuitry computes LLRs using only the nearest neighbors in the second symbol mapping to the signal constellation set.

83. The detector of claim 64, further comprising a decoder for an error correcting code.

84. The detector of claim 83 wherein the decoder is an LDPC decoder.

* * * * *